United States Patent
Ma et al.

(10) Patent No.: US 12,125,426 B2
(45) Date of Patent: *Oct. 22, 2024

(54) DATA DRIVING CIRCUIT AND DISPLAY DEVICE INCLUDING THE SAME

(71) Applicants: SAMSUNG DISPLAY CO., LTD., Yongin-si (KR); KOREAN ADVANCE INSTITUTE OF SCIENCE AND TECHNOLOGY, Daejeon (KR)

(72) Inventors: Hyung Gun Ma, Yongin-si (KR); Gyu Wan Lim, Daejeon (KR); Gyeong Gu Kang, Daejeon (KR); Hyun Sik Kim, Daejeon (KR); Keum Dong Jung, Yongin-si (KR); Moon Jae Jeong, Yongin-si (KR)

(73) Assignees: SAMSUNG DISPLAY CO., LTD, Gyeonggi-Do (KR); KOREAN ADVANCE INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/210,960

(22) Filed: Jun. 16, 2023

(65) Prior Publication Data

US 2023/0326384 A1 Oct. 12, 2023

Related U.S. Application Data

(63) Continuation of application No. 17/985,554, filed on Nov. 11, 2022, now Pat. No. 11,721,265.

(30) Foreign Application Priority Data

Feb. 17, 2022 (KR) .......................... 10-2022-0021107

(51) Int. Cl.
*G09G 3/20* (2006.01)
*G06F 3/044* (2006.01)
(Continued)

(52) U.S. Cl.
CPC .............. *G09G 3/20* (2013.01); *G06F 3/044* (2013.01); *G09G 3/3208* (2013.01);
(Continued)

(58) Field of Classification Search
CPC .......... G09G 3/20; G09G 3/36; G09G 3/3685; G09G 3/3696; G09G 2300/0426;
(Continued)

(56) References Cited

U.S. PATENT DOCUMENTS 8,217,883 B2 7/2012 Ishii et al.
8,581,824 B2 11/2013 Baek et al.
(Continued)

FOREIGN PATENT DOCUMENTS

KR 20120092810 A 8/2012
KR 1020120104895 A 9/2012
(Continued)

OTHER PUBLICATIONS

Chih-Wen Lu et al.; A 10-bit 1026-Channel Column Driver IC with Partially Segmented Piecewise Linear Digital-to-Analog Converters for UHD TFT-LCDs with One Billion Collor Display; IEEE Journal of Solid-State Circuits; vol. 54, Issue. 10, pp. 2703-2716, Jul. 29, 2019.

(Continued)

*Primary Examiner* — Nelson M Rosario
(74) *Attorney, Agent, or Firm* — CANTOR COLBURN LLP

(57) ABSTRACT

A data driving circuit includes: a resistor string in which a plurality of resistors are connected in series; and a plurality of data channels connected to a high voltage node, intermediate voltage nodes, and a low voltage node of the resistor string and configured to convert a digital data signal into an analog data voltage. Each of the plurality of data channels includes: a main digital-to-analog converter connected to the (Continued)

high voltage node, the intermediate voltage nodes, and the low voltage node, a multiplier connected to an output terminal of the main digital-to-analog converter, a sub digital-to-analog converter connected to some of the high voltage node, the intermediate voltage nodes, and the low voltage node, and a voltage synthesizer connected to an output terminal of the multiplier and an output terminal of the sub digital-to-analog converter.

19 Claims, 19 Drawing Sheets

(51) Int. Cl.
*G09G 3/3208* (2016.01)
*H10K 59/40* (2023.01)
(52) U.S. Cl.
CPC ............ *G09G 2300/0828* (2013.01); *G09G 2300/0852* (2013.01); *G09G 2300/0871* (2013.01); *G09G 2310/027* (2013.01); *G09G 2310/0291* (2013.01); *G09G 2330/028* (2013.01); *H10K 59/40* (2023.02)
(58) Field of Classification Search
CPC ...... G09G 2310/027; G09G 2330/028; H03M 1/66; H03M 1/687; H03M 1/745; H03M 1/765
See application file for complete search history.

(56) References Cited

U.S. PATENT DOCUMENTS

| | | | |
|---|---|---|---|
| 9,001,092 B2 | 4/2015 | Kim | |
| 10,593,269 B2 | 3/2020 | Kim et al. | |
| 2012/0206506 A1 | 8/2012 | Kim et al. | |
| 2013/0135362 A1* | 5/2013 | Kim | ................ G09G 3/3696 345/690 |
| 2015/0310835 A1* | 10/2015 | Lee | ..................... G09G 5/18 345/213 |

FOREIGN PATENT DOCUMENTS

| | | |
|---|---|---|
| KR | 1020130061422 A | 6/2013 |
| KR | 101534150 B1 | 7/2015 |
| KR | 102018087919 A | 8/2018 |

OTHER PUBLICATIONS

Hyung-Min Lee, et al., "An Aerea and Power efficient Interpolation Scheme Using Variable Current Control for 10-Bit Data Drivers in Mobile Active-Matrix LCDs"; IEEE Transactions on Consumer Electronics; vol. 65, Issue. 2, pp. 253-262, Feb. 21, 2019.

Hyun-Sik Kim, et al; A 10-Bit Column-Driver IC with Parasitic-Insensitive Iterative Charge-Sharing Based Capacitor-String Interpolation for Mobile Active-Matrix LCDs; IEEE Journal of Solid-State Circuits; vol. 49, No. 3, pp. 766-785, Feb. 19, 2014.

* cited by examiner

DATA DRIVING CIRCUIT AND DISPLAY DEVICE INCLUDING THE SAME

This application is a continuation of U.S. patent application Ser. No. 17/985,554, filed on Nov. 11, 2022, which claims priority to Korean Patent Application No. 10-2022-0021107, filed on Feb. 17, 2022, and all the benefits accruing therefrom under 35 U.S.C. § 119, the content of which in its entirety is herein incorporated by reference.

BACKGROUND

1. Field

The disclosure relates to a data driving circuit and a display device including the same.

2. Description of the Related Art

As an information technology is developed, importance of a display device, which is a connection medium between a user and information, is emphasized. Accordingly, use of the display device such as a liquid crystal display device, and an organic light emitting display device is increasing.

The display device includes a plurality of pixels for displaying an image. As each pixel receives an analog data voltage and emits light with a luminance corresponding to the analog data voltage, the display device may display an image.

The display device may include a data driving circuit (that is, a data driver) to generate such an analog data voltage. However, a range of the analog data voltage is gradually increasing for high image beauty, and to this end, the data driving circuit is desirable to include transistors (for example, high-voltage MOSFETs ("HVMOS")) driven in a high voltage. Since the HVMOS additionally requires a level shifter for controlling a gate voltage, and the area of the HVMOS itself is large, there is a disadvantage that it is difficult to integrate the data driving circuit into an integrated chip ("IC").

SUMMARY

A technical aspect is to provide a data driving circuit that may be configured of a low-voltage MOSFET ("LVMOS") having a small area and thus may be easily integrated, and a display device including the data driving circuit.

According to an embodiment of the disclosure, a data driving circuit includes: a resistor string in which a plurality of resistors are connected in series, and a plurality of data channels connected to a high voltage node, intermediate voltage nodes, and a low voltage node of the resistor string and configured to convert a digital data signal into an analog data voltage. Each of the plurality of data channels includes a main digital-to-analog converter connected to the high voltage node, the intermediate voltage nodes, and the low voltage node, a multiplier connected to an output terminal of the main digital-to-analog converter, a sub digital-to-analog converter connected to some of the high voltage node, the intermediate voltage nodes, and the low voltage node, and a voltage synthesizer connected to an output terminal of the multiplier and an output terminal of the sub digital-to-analog converter.

The voltage synthesizer may generate the analog data voltage by synthesizing an output voltage of the multiplier and an output voltage of the sub digital-to-analog converter.

The output voltage of the multiplier may be a voltage corresponding to a most significant bits ("MSB") of the digital data signal, and the output voltage of the sub digital-to-analog converter may be a voltage corresponding to a least significant bits ("LSB") of the digital data signal.

The voltage synthesizer may include: a sampling capacitor, a first switch configured to connect the output terminal of the sub digital-to-analog converter and a first electrode of the sampling capacitor, an amplifier, a second switch configured to connect a second electrode of the sampling capacitor and a first input terminal of the amplifier, a third switch configured to connect one of the high voltage node, the intermediate voltage nodes, and the low voltage node to a second input terminal of the amplifier, a fourth switch configured to connect the output terminal of the multiplier and the second input terminal of the amplifier, and a fifth switch configured to connect the first electrode of the sampling capacitor and the first input terminal of the amplifier.

The first switch and the third switch may be turned on when receiving a first switching signal, the fourth switch may be turned on when receiving an inverted signal of the first switching signal, the second switch may be turned on when receiving a second switching signal, and the fifth switch may be turned on when receiving an inverted signal of the second switching signal.

The voltage synthesizer may further include: a first offset inverter configured to connect one of the second switch to the first input terminal of the amplifier and the second input terminal of the amplifier and connect the third switch to another one of the first input terminal of the amplifier and the second input terminal of the amplifier, and a second offset inverter positioned inside the amplifier, and connected between the first input terminal of the amplifier and the second input terminal of the amplifier.

When the first offset inverter and the second offset inverter receive the first switching signal, the first offset inverter and the second offset inverter may invert an input offset voltage of the amplifier and apply the input offset voltage to the second electrode of the sampling capacitor.

The multiplier may output an output voltage corresponding to N times an input voltage of the multiplier, the multiplier may include (N−1) capacitors, and N may be an integer greater than 1.

The (N−1) capacitors may include: a first capacitor, a second capacitor, and a third capacitor, the multiplier may further include a sixth switch configured to connect an input terminal of the multiplier and a first electrode of the first capacitor, a seventh switch configured to connect a second electrode of the first capacitor and a reference power, an eighth switch configured to connect the second electrode of the first capacitor and the input terminal of the multiplier, a ninth switch configured to connect the first electrode of the first capacitor and a first electrode of the second capacitor, a tenth switch configured to connect a second electrode of the second capacitor and the reference power, an eleventh switch configured to connect the second electrode of the second capacitor and the input terminal of the multiplier, a twelfth switch configured to connect the first electrode of the second capacitor and a first electrode of the third capacitor, a thirteenth switch configured to connect a second electrode of the third capacitor and the reference power, a fourteenth switch configured to connect the second electrode of the third capacitor and the input terminal of the multiplier, and a fifteenth switch configured to connect the first electrode of the third capacitor and the output terminal of the multiplier.

The sixth, seventh, eleventh, twelfth, and thirteenth switches may be turned on when a clock signal is a first logic level, and the eighth, ninth, tenth, fourteenth, and fifteenth switches may be turned on when the clock signal is a second logic level different from the first logic level.

According to an embodiment of the disclosure, a display device includes: pixels configured to receive an analog data voltage and display an image corresponding to the analog data voltage, and a data driver configured to transmit the analog data voltage to the pixels. The data driver includes a resistor string in which a plurality of resistors are connected in series, and a plurality of data channels connected to a high voltage node, intermediate voltage nodes, and a low voltage node of the resistor string and configured to convert a digital data signal into the analog data voltage. Each of the plurality of data channels includes a main digital-to-analog converter connected to the high voltage node, the intermediate voltage nodes, and the low voltage node, a multiplier connected to an output terminal of the main digital-to-analog converter, a sub digital-to-analog converter connected to some of the high voltage node, the intermediate voltage nodes, and the low voltage node, and a voltage synthesizer connected to an output terminal of the multiplier and an output terminal of the sub digital-to-analog converter.

The voltage synthesizer may generate the analog data voltage by synthesizing an output voltage of the multiplier and an output voltage of the sub digital-to-analog converter.

The output voltage of the multiplier may be a voltage corresponding to an MSB of the digital data signal, and the output voltage of the sub digital-to-analog converter may be a voltage corresponding to an LSB of the digital data signal.

The voltage synthesizer may include: a sampling capacitor, a first switch configured to connect the output terminal of the sub digital-to-analog converter and a first electrode of the sampling capacitor, an amplifier, a second switch configured to connect a second electrode of the sampling capacitor and a first input terminal of the amplifier, a third switch configured to connect one of the high voltage node, the intermediate voltage nodes, and the low voltage node to a second input terminal of the amplifier, a fourth switch configured to connect the output terminal of the multiplier and the second input terminal of the amplifier, and a fifth switch configured to connect the first electrode of the sampling capacitor and the first input terminal of the amplifier.

The first switch and the third switch may be turned on when receiving a first switching signal, the fourth switch may be turned on when receiving an inverted signal of the first switching signal, the second switch may be turned on when receiving a second switching signal, and the fifth switch may be turned on when receiving an inverted signal of the second switching signal.

The voltage synthesizer may further include: a first offset inverter configured to connect the second switch to one of the first input terminal of the amplifier and the second input terminal of the amplifier and connect the third switch to another one of the first input terminal of the amplifier and the second input terminal of the amplifier, and a second offset inverter positioned inside the amplifier, and connected between the first input terminal of the amplifier and the second input terminal of the amplifier.

When the first offset inverter and the second offset inverter receive the first switching signal, the first offset inverter and the second offset inverter may invert an input offset voltage of the amplifier and apply the input offset voltage to the second electrode of the sampling capacitor.

The multiplier may output an output voltage corresponding to N times an input voltage of the multiplier, the multiplier may include (N−1) capacitors, and N may be an integer greater than 1.

The (N−1) capacitors may include a first capacitor, a second capacitor, and a third capacitor, the multiplier may further include a sixth switch configured to connect an input terminal of the multiplier and a first electrode of the first capacitor, a seventh switch configured to connect a second electrode of the first capacitor and a reference power, an eighth switch configured to connect the second electrode of the first capacitor and the input terminal of the multiplier, a ninth switch configured to connect the first electrode of the first capacitor and a first electrode of the second capacitor, a tenth switch configured to connect a second electrode of the second capacitor and the reference power, an eleventh switch configured to connect the second electrode of the second capacitor and the input terminal of the multiplier, a twelfth switch configured to connect the first electrode of the second capacitor and a first electrode of the third capacitor, a thirteenth switch configured to connect a second electrode of the third capacitor and the reference power, a fourteenth switch configured to connect the second electrode of the third capacitor and the input terminal of the multiplier, and a fifteenth switch configured to connect the first electrode of the third capacitor and an output terminal of the multiplier.

The sixth, seventh, eleventh, twelfth, and thirteenth switches may be turned on when a clock signal is a first logic level, and the eighth, ninth, tenth, fourteenth, and fifteenth switches may be turned on when the clock signal is a second logic level different from the first logic level.

The data driving circuit and the display device including the data driving circuit according to the disclosure may be configured of a low-voltage MOSFET (LVMOS) having a small area, and thus integration is easy.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
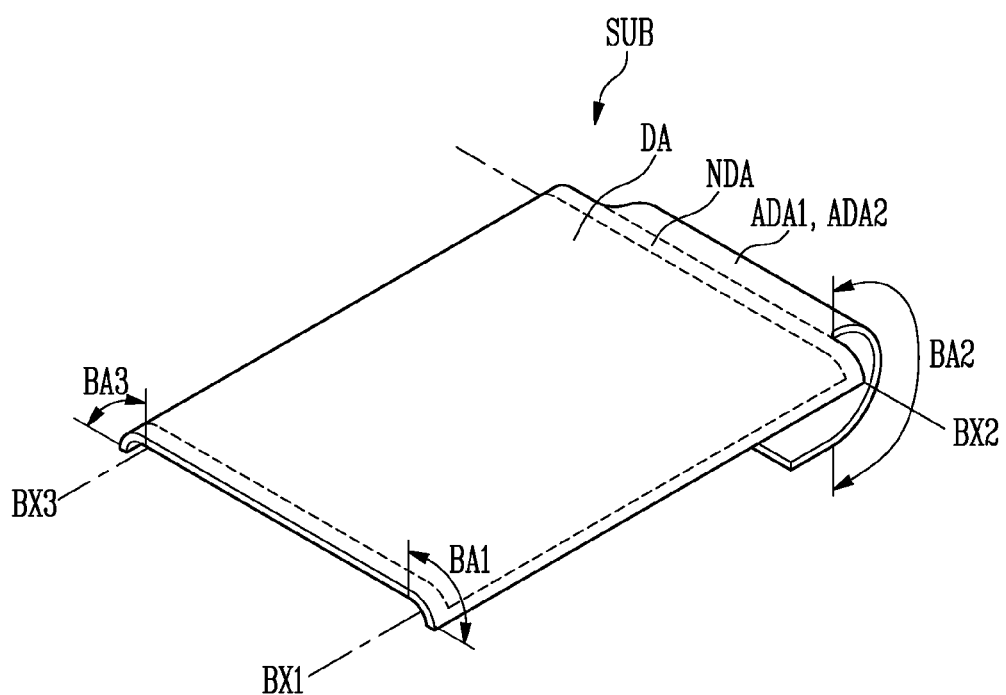
FIGS. 1 to 7 are diagrams illustrating an exemplary configuration of a display device.

Hereinafter, various embodiments of the disclosure will be described in detail with reference to the accompanying drawings so that those skilled in the art may easily carry out the disclosure. The disclosure may be implemented in various different forms and is not limited to the embodiments described herein.

In order to clearly describe the disclosure, parts that are not related to the description are omitted, and the same or similar elements are denoted by the same reference numerals throughout the specification. Therefore, the above-described reference numerals may be used in other drawings.

In addition, sizes and thicknesses of each component shown in the drawings are arbitrarily shown for convenience of description, and thus the disclosure is not necessarily limited to those shown in the drawings. In the drawings, thicknesses may be exaggerated to clearly express various layers and areas.

In addition, an expression "is the same" in the description may mean "is substantially the same". That is, the expression "is the same" may be the same enough for those of ordinary skill to understand that it is the same. Other expressions may also be expressions in which "substantially" is omitted.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIGS. 1 to 7 are diagrams illustrating an exemplary configuration of a display device.

Figure 2:
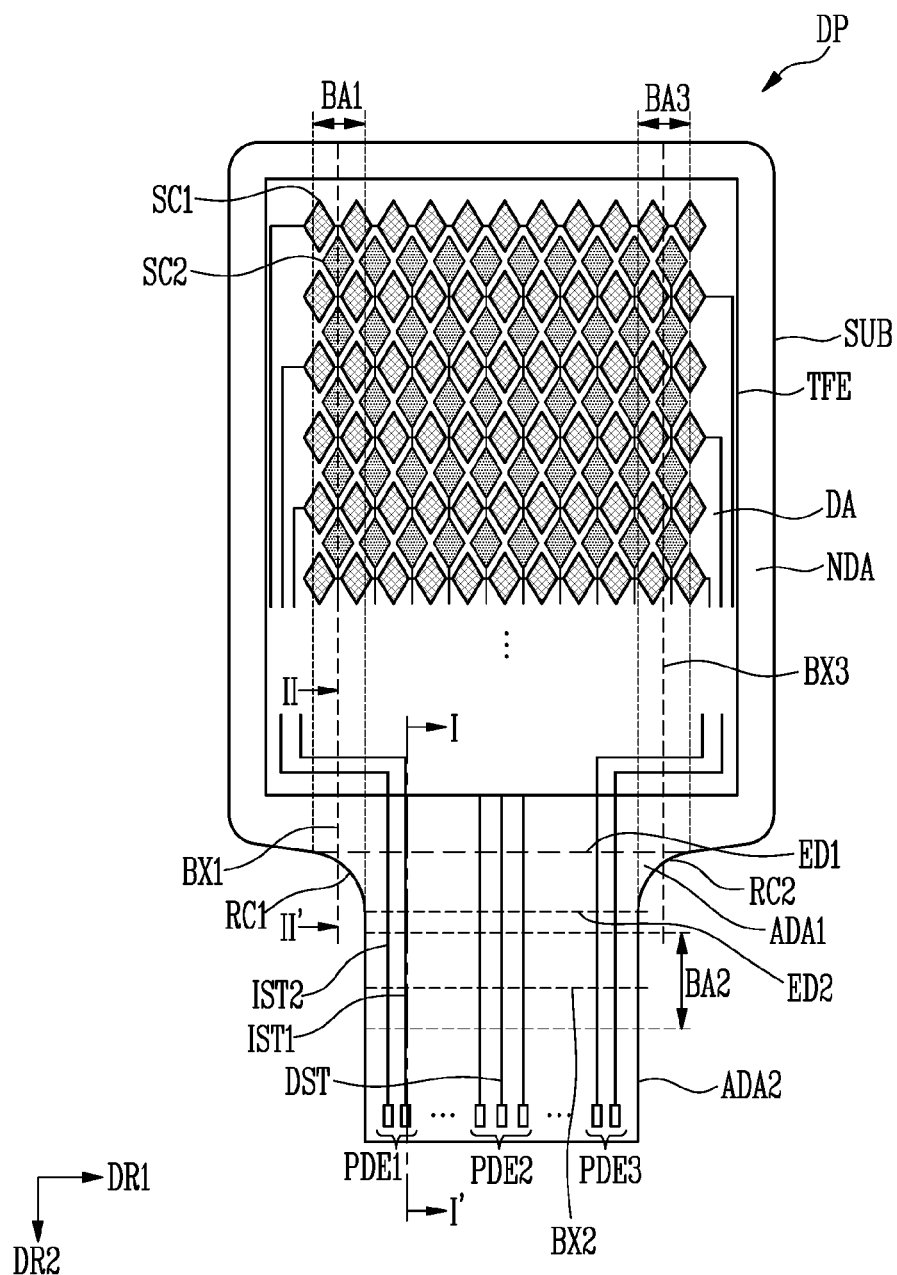

FIG. 1 is a diagram illustrating a substrate according to an embodiment of the disclosure, and FIG. 2 is a diagram illustrating a display device according to an embodiment of the disclosure.

In the following embodiments, a plane may define a position in a first direction DR1 and a second direction DR2, and a height may define a position in a third direction DR3 (refer to FIG. 3). The first direction DR1, the second direction DR2, and the third direction DR3 may be directions orthogonal to each other.

The substrate SUB may include a display area DA, a non-display area NDA, a first additional area ADA1, and a second additional area ADA2.

The display area DA may have a rectangular shape. Each corner of the display area DA may be an angular shape or a curved shape. In addition, in a case of a circular display, the display area DA may have a circular shape. In addition, the display area DA may be configured of a polygon other than a quadrangle, an ellipse, or the like. As described above, a shape of the display area DA may be set differently according to a product.

Pixels may be positioned on the display area DA. Each of the pixels may include a light emitting diode or may include a liquid crystal layer according to a type of a display device DP.

The non-display area NDA may surround an outer periphery of the display area DA. For example, the non-display area NDA may have a rectangular shape. Each corner of the non-display area NDA may be an angular shape or a curved shape. FIG. 2 is shown under an assumption that each corner of the non-display area NDA has a curved shape. The non-display area NDA may have a circular shape. Since minimizing the non-display area NDA is advantageous to a narrow bezel structure, a shape of the non-display area NDA may be similar to the shape of the display area DA.

The first additional area ADA1 may be positioned between the non-display area NDA and the second additional area ADA2. The first additional area ADA1 may be connected to the non-display area NDA at a first boundary ED1. The first additional area ADA1 may be connected to the second additional area ADA2 at a second boundary ED2. Each of the first boundary ED1 and the second boundary ED2 may extend in the first direction DR1.

A width of the first additional area ADA1 may be narrower from the first boundary ED1 to the second boundary ED2. That is, the width of the first additional area ADA1 in the first direction DR1 may be narrower toward the second direction DR2. Therefore, the first additional area ADA1 may include a curved first side RC1 and a second side RC2. The sides RC1 and RC2 may be convex toward an inside of the substrate (for example, a center of the substrate).

FIG. 2 shows that the first additional area ADA1 includes the two sides RC1 and RC2 in the first direction DR1 and a direction opposite to the first direction DR1. In another embodiment, a boundary positioned in the first direction DR1 may coincide with a boundary of the non-display area NDA, and thus the first additional area ADA1 may include only the first side RC1. In further another embodiment, a boundary positioned in the direction opposite to the first direction DR1 may coincide with the boundary of the non-display area NDA, and thus the first additional area ADA1 may include only the second side RC2.

The second additional area ADA2 may have a rectangular shape. Each corner positioned in the second direction DR2 of the second additional area ADA2 may be an angular shape or a curved shape. FIG. 2 is shown under an assumption that each corner positioned in the second direction DR2 of the second additional area ADA2 is an angular shape.

An encapsulation layer TFE may be positioned on the pixels. For example, the encapsulation layer TFE may cover the pixels in the display area DA and a boundary of the encapsulation layer TFE may be positioned in the non-display area NDA. The encapsulation layer TFE may cover light emitting elements and circuit elements of the pixels of the display area DA, thereby preventing breakage from external moisture or impact.

Sensing electrodes SC1 and SC2 may be positioned on the encapsulation layer TFE. The sensing electrodes SC1 and SC2 may sense touch, hovering, gesture, proximity, or the like by a body of a user. The sensing electrodes SC1 and SC2 may be configured in different shapes according to various methods such as a resistive type, a capacitive type, an electro-magnetic type ("EM"), and an optical type. For example, when the sensing electrodes SC1 and SC2 are configured in the capacitive type, the sensing electrodes SC1 and SC2 may be configured in a self-capacitive type, a mutual-capacitive type, or the like. Hereinafter, for convenience of description, a case in which the sensing electrodes SC1 and SC2 are configured in a mutual-capacitive type is exemplified.

When the sensing electrodes SC1 and SC2 are configured in the mutual-capacitive type, a driving signal may be transmitted through a sensing line corresponding to the first sensing electrode SC1, and a sensing signal may be received through a sensing line corresponding to the second sensing electrode SC2 forming a mutual capacitance with the first sensing electrode SC1. When the body of the user is proximity, the mutual capacitance between the first sensing electrode SC1 and the second sensing electrode SC2 may be changed, and thus touch-or-not of the user may be detected in accordance with a difference of a sensing signal according to the change of the mutual capacitance. In another embodiment, the driving signal may be transmitted through the sensing line corresponding to the second sensing electrode SC2, and the sensing signal may be received through the sensing line corresponding to the first sensing electrode SC1 forming a mutual capacitance with the second sensing electrode SC2.

Pads PDE1, PDE2, and PDE3 may be positioned on the second additional area ADA2. The pads PDE1 and PDE3 may be connected to the sensing electrodes SC1 and SC2 positioned above the encapsulation layer through the sensing lines IST1 and IST2. The pads PDE1 and PDE3 may be connected to an external touch integrated chip (IC). In addition, the pads PDE2 may be connected to the pixels positioned under the encapsulation layer TFE or a driver of the pixels through display lines DST. The driver may include a scan driver, an emission driver, a data driver, or the like. The driver may be positioned under the encapsulation layer TFE or may be positioned in an external display IC connected through the pads PDE2.

When the display device DP is the mutual-capacitive type, a touch IC may transmit the driving signal through the first sensing line IST1 and receive the sensing signal through the second sensing line IST2. In another embodiment, the driving signal may be transmitted through the second sensing line IST2 and the sensing signal may be received through the first sensing line IST1. For reference, when the display device DP is the self-capacitive type, a driving method of the first sensing line IST1 and the second sensing line IST2 may be the same. The display lines DST may include a control line, a data line, a power line, or the like, and may provide signals so that the pixels may display an image. The signals may be provided from the driver connected to the display lines DL.

FIG. 1 shows a state in which the substrate SUB is bent, and FIG. 2 shows a state in which the substrate SUB is not bent. The display device DP may be bent as shown in FIG. 1 after elements are stacked on the substrate SUB in a state in which the display device DP is not bent as shown in FIG. 2.

The substrate SUB may include a first bending area BA1 extending from the first side RC1 of the first additional area ADA1 to overlap the non-display area NDA in a plan view. Additionally, the first bending area BA1 may be extended to overlap the display area DA in a plan view. That is, each of the display area DA, the non-display area NDA, and the first additional area ADA1 may partially overlap the first bending area BA1 in a plan view. Here, the "plan view" may be defined as a view in a third direction DR3, like FIG. 2. The first bending area BA1 may have a width of the first direction DR1 and a length extending in the second direction DR2. A first bending axis BX1 may be defined as a folding line extending in the second direction DR2 from a center of the first bending area BA1. According to an embodiment, the first bending area BA1 may be a portion where a stress is reduced due to removal of a portion of an insulating layer or the like, differently from another portion around the first bending area BA1. According to an embodiment, the first bending area BA1 may have the same configuration as the other portion around first bending area BA1.

The substrate SUB may include a third bending area BA3 extending from the second side RC2 of the first additional area ADA1 to overlap the non-display area NDA in a plan view. Additionally, the third bending area BA3 may extend to overlap the display area DA in a plan view. That is, each of the display area DA, the non-display area NDA, and the first additional area ADA1 may partially overlap the third bending area BA3 in a plan view. The third bending area BA3 may have a width of the first direction DR1 and a length extending in the second direction DR2. A third bending axis BX3 may be defined as a folding line extending in the second direction DR2 from a center of the third bending area BA3. According to an embodiment, the third bending area BA3 may be a portion where the stress is reduced by removal of a portion of the insulating layer or the like, differently from another portion around the third bending area BA3. According to an embodiment, the third bending area BA3 may have the same configuration as the other portion around the third bending area BA3.

The second additional area ADA2 may include a second bending area BA2. The second bending area BA2 may have a width of the second direction DR2 and a length extending in the first direction DR1. A second bending axis BX2 may be defined as a folding line extending in the first direction DR1 from a center of the second bending area BA2. According to an embodiment, the second bending area BA2 may be a portion where the stress is reduced due to removal of a portion of the insulating layer or the like, differently from another portion around the second bending area BA2. According to an embodiment, the second bending area BA2 may have the same configuration as the other portion around the second bending area BA2.

The first to third bending areas BA1, BA2, and BA3 may not overlap with each other in a plan view.

Here, the term "folded" is intended to mean that a shape is not fixed and may be modified from its original shape to another shape, and may include being folded, curved, or rolled along one or more bending axes. A side bezel width of the first direction DR1 and the direction opposite to the first direction DR1 of the display device DP may be reduced by the first and third bending areas BA1 and BA3. In addition, a side bezel width of the second direction DR2 of the display device DP may be reduced by the second bending area BA2.

Figure 3:
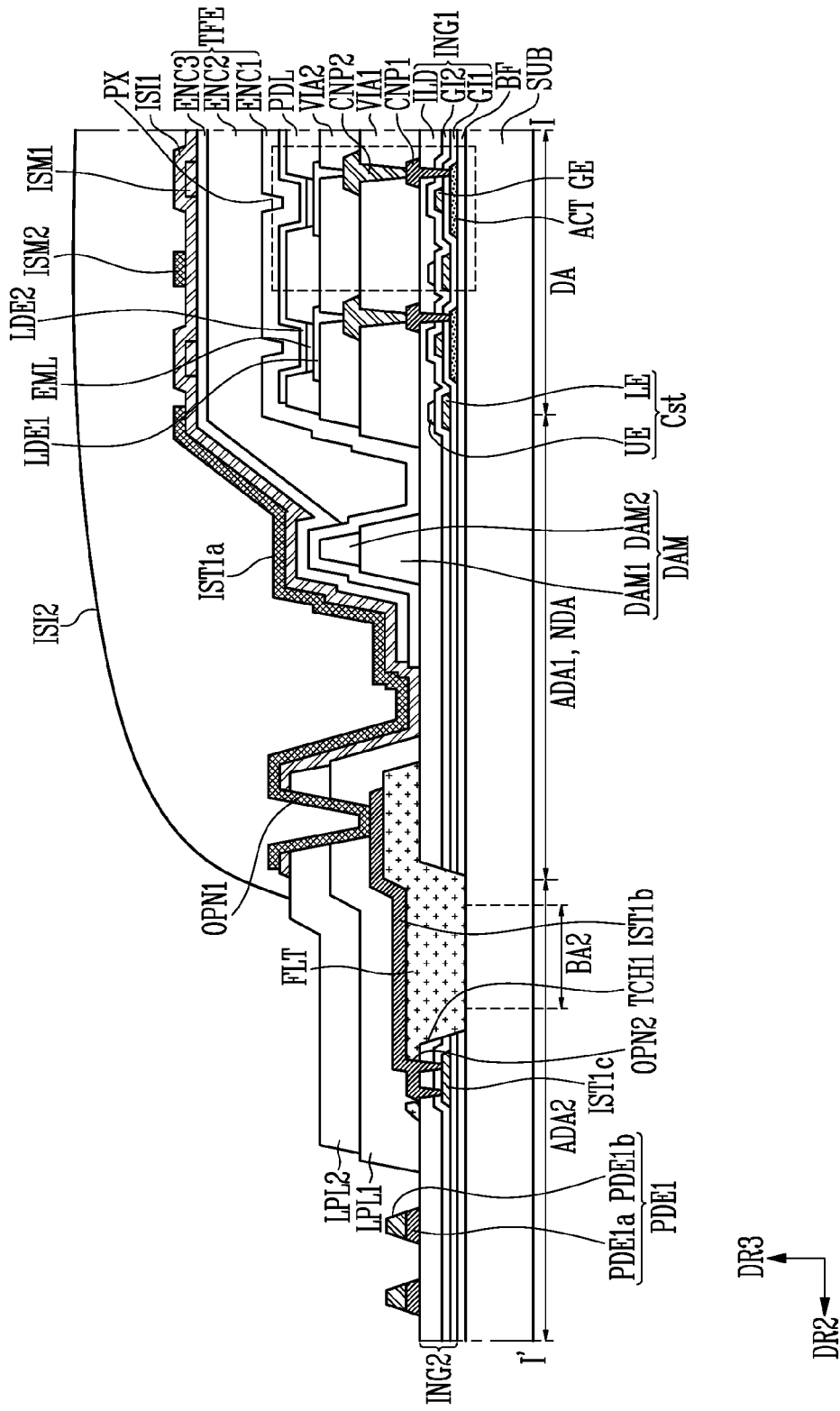

FIG. 3 is an embodiment of a cross-section taken along a line I-I' of FIG. 2. It is assumed that the line I-I' of FIG. 2 passes through the first pad PDE1 and the first sensing line IST1.

First, the display area DA is described. In an embodiment of the disclosure, pixels PX are provided in the display area DA. Each pixel PX may include a transistor connected to a corresponding line of the display lines DST, a light emitting element connected to the transistor, and a capacitor Cst. In FIG. 3, for convenience of description, one transistor, one light emitting element, and one capacitor Cst are shown with respect to one pixel PX as an example.

The substrate SUB may be formed of an insulating material such as glass, or resin. In addition, the substrate SUB may be formed of a material having flexibility so as to be bent or folded, and may have a single layer structure or a multiple layer structure.

In an embodiment, for example, the substrate SUB may include at least one of polystyrene, polyvinyl alcohol, polymethyl methacrylate, polyethersulfone, polyacrylate, polyetherimide, polyethylene na phthalate, polyethylene terephthalate, polyphenylene sulfide, polyarylate, polyimide, polycarbonate, triacetate cellulose, and cellulose acetate propionate. However, a material forming the substrate SUB may be variously changed, and may be formed of fiber reinforced plastic ("FRP") or the like.

In an embodiment, for example, when the substrate SUB has the multiple layer structure, inorganic materials such as silicon nitride, silicon oxide, and silicon oxynitride may be interposed between a plurality of layers in a single layer or a plurality of layers.

A buffer layer BF may cover the substrate SUB. The buffer layer BF may prevent an impurity from diffusing into a channel CH of the transistor. The buffer layer BF may be an inorganic insulating layer formed of an inorganic material. For example, the buffer layer BF may be formed of silicon nitride, silicon oxide, silicon oxynitride or the like, and may be omitted according to the material of the substrate SUB and a process condition. According to an embodiment, a barrier layer may be further provided.

An active layer ACT may be positioned on the buffer layer BF. The active layer ACT may be patterned to configure the channel, a source electrode, and a drain electrode of the transistor, or configure a line. The active layer ACT may be formed of a semiconductor material. The active layer ACT may be a semiconductor pattern formed of polysilicon, amorphous silicon, oxide semiconductor, or the like. The channel of the transistor may be a semiconductor pattern which is not doped with an impurity, and may be an intrinsic semiconductor. The source electrode, the drain electrode, and the line may be a semiconductor pattern doped with an impurity. As the impurity, an impurity such as an n-type impurity, a p-type impurity, and other metals may be used.

A first gate insulating layer GI1 may cover the active layer ACT. The first gate insulating layer GI may be an inorganic insulating layer formed of an inorganic material. As the inorganic material, an inorganic insulating material such as polysiloxane, silicon nitride, silicon oxide, or silicon oxynitride may be used.

A gate electrode GE of the transistor and a lower electrode LE of the capacitor Cst may be positioned on the first gate insulating layer GI1. The gate electrode GE may overlap an area corresponding to the channel CH in a plan view.

The gate electrode GE and the lower electrode LE may be formed of a metal. For example, the gate electrode GE may be formed of at least one of a metal such as gold (Au), silver (Ag), aluminum (Al), molybdenum (Mo), chromium (Cr), titanium (Ti), nickel (Ni), neodymium, or copper (Cu), or an alloy of the metals. In addition, the gate electrode GE may be formed of a single layer, but is not limited thereto, and may be formed of multiple layers in which two or more materials of metals and alloys are stacked in another embodiment.

A second gate insulating layer GI2 may cover the gate electrode GE and the lower electrode LE. The second gate insulating layer GI2 may be an inorganic insulating layer formed of an inorganic material. As the inorganic material, polysiloxane, silicon nitride, silicon oxide, silicon oxynitride, or the like may be used.

An upper electrode UE of the capacitor Cst may be positioned on the second gate insulating layer GI2. The upper electrode UE of the capacitor Cst may be formed of a metal. For example, the upper electrode UE may be formed of at least one of a metal such as gold (Au), silver (Ag), aluminum (Al), molybdenum (Mo), chromium (Cr), titanium (Ti), nickel (Ni), neodymium, or copper (Cu), or an alloy of metals. In addition, the upper electrode UE may be formed of a single layer, but is not limited thereto, and may be formed of multiple layers in which two or more materials of metals and alloys are stacked in another embodiment.

The lower electrode LE and the upper electrode UE may configure the capacitor Cst with the second gate insulating layer GI2 interposed therebetween. In FIG. 3, the capacitor Cst is shown as a two-layer electrode structure of the lower electrode LE and the upper electrode UE. However, in another embodiment, the capacitor Cst may be configured as a three-layer electrode structure using the active layer ACT, a three-layer electrode structure using an electrode of the same layer as a first connection pattern CNP1, or an electrode structure of four or more layers.

An interlayer insulating layer ILD may cover the upper electrode UE. The interlayer insulating layer ILD may be an inorganic insulating layer formed of an inorganic material. As the inorganic material, polysiloxane, silicon nitride, silicon oxide, silicon oxynitride, or the like may be used.

In the present embodiment, for convenience of description, the first gate insulating layer GI1, the second gate insulating layer GI2, and the interlayer insulating layer ILD may be referred to as a first insulating layer group ING1. The first insulating layer group ING1 may cover a portion of the transistor. According to an embodiment, the first insulating layer group ING1 may further include the buffer layer BF.

The first connection pattern CNP1 may be positioned on the interlayer insulating layer ILD. The first connection pattern CNP1 may be in contact with each of the source electrode and the drain electrode of the active layer ACT through a contact hole formed through the interlayer insulating layer ILD, the second gate insulating layer GI2, and the first gate insulating layer GI1.

The first connection pattern CNP1 may be formed of a metal. For example, the source electrode SE and the drain electrode DE may be formed of at least one of a metal such as gold (Au), silver (Ag), aluminum (Al), molybdenum (Mo), chromium (Cr), titanium (Ti), nickel (Ni), neodymium, or copper (Cu), or an alloy of metals.

Although not shown, according to an embodiment, a passivation layer may cover the first connection pattern CNP1. The passivation layer may be an inorganic insulating layer formed of an inorganic material. As the inorganic material, polysiloxane, silicon nitride, silicon oxide, silicon oxynitride, or the like may be used.

A first via layer VIA1 may cover the passivation layer or the transistor. The first via layer VIA1 may be an organic insulating layer formed of an organic material. As the organic material, an organic insulating material such as a polyacrylic compound, a polyimide compound, a fluorocarbon compound such as Teflon, or a benzocyclobutene compound may be used. The organic layer may be deposited by a method such as evaporation.

The second connection pattern CNP2 may be connected to the first connection pattern CNP1 through an opening of the first via layer VIA1. The second connection pattern CNP2 may be formed of at least one of a metal such as gold (Au), silver (Ag), aluminum (Al), molybdenum (Mo), chromium (Cr), titanium (Ti), nickel (Ni), neodymium, or copper (Cu), or an alloy of metals.

The second via layer VIA2 may cover the first via layer VIA1 and the second connection pattern CNP2. The second via layer VIA2 may be an organic insulating layer formed of an organic material. As the organic material, an organic insulating material such as a polyacrylic compound, a polyimide compound, a fluorocarbon compound such as Teflon, or a benzocyclobutene compound may be used.

A first light emitting element electrode LDE1 may be connected to the second connection pattern CNP2 through an opening of the second via layer VIA2. Here, the first light emitting element electrode LDE1 may be an anode of the light emitting element according to an embodiment.

According to an embodiment, a configuration of the second via layer VIA2 and the second connection pattern CNP2 may be omitted and the first light emitting element electrode LDE1 may be directly connected to the first connection pattern CNP1 through the opening of the first via layer VIA1.

The first light emitting element electrode LDE1 may be formed of a metal layer such as Ag, Mg, Al, Pt, Pd, Au, Ni, Nd, Ir, Cr, or an alloy thereof, indium tin oxide ("ITO"), indium zinc oxide ("IZO"), zinc oxide (ZnO), indium tin zinc oxide ("ITZO"), and/or the like. The first light emitting element electrode LDE1 may be formed of one type of metal, but is not limited thereto, and may be formed of two or more types of metals, for example, an alloy of Ag and Mg in another embodiment.

The first light emitting element electrode LDE1 may be formed of a transparent conductive layer when an image is to be provided in a downward direction of the substrate SUB, and the first light emitting element electrode LDE1 may be formed of a metal reflective layer and/or a transparent conductive layer when an image is to be provided in an upward direction of the substrate SUB.

A pixel defining layer PDL for partitioning an emission area of each pixel PX is provided on the substrate SUB on which the first light emitting element electrode LDE1 or the like are formed. The pixel defining layer PDL may be an organic insulating layer formed of an organic material. As the organic material, an organic insulating material such as a polyacrylic compound, a polyimide compound, a fluorocarbon compound such as Teflon, or a benzocyclobutene compound may be used.

The pixel defining layer PDL may expose an upper surface of the first light emitting element electrode LDE1 and may protrude from the substrate SUB along a periphery of the pixel PX. A light emitting layer EML may be provided in an area of the pixel PX surrounded by the pixel defining layer PDL.

The light emitting layer EML may include a low molecular material or a high molecular material. Examples of the low molecular material may include copper phthalocyanine (CuPc), N,N-di (naphthalen-1-yl)-N, N'-diphenyl-benzidine (N,N'-Di(naphthalene-1-yl)-N, N'-diphenyl-benzidine ("NPB"), tris-8-hydroxyquinoline aluminum (Alq3), or the like. These materials may be formed by a vacuum deposition method. Examples of the high molecular material may include PEDOT, poly-phenylenevinylene ("PPV"), polyfluorene, or the like.

The light emitting layer EML may be provided as a single layer, but may be provided as multiple layers including various functional layers. When the light emitting layer EML is provided as the multiple layers, the light emitting layer EML may have a structure in which a hole injection layer ("HIL"), a hole transport layer ("HTL"), an emission layer ("EML"), an electron transport layer ("ETL"), an electron injection layer ("EIL"), or the like are stacked in a single or composite structure. The light emitting layer EML may be formed by a screen printing method, an inkjet printing method, a laser induced thermal imaging ("LITI") method, or the like.

According to an embodiment, at least a portion of the light emitting layer EML may be integrally formed over a plurality of first light emitting element electrodes LDE1, and may also be individually provided to correspond to the plurality of first light emitting element electrodes LDE1, respectively.

A second light emitting element electrode LDE2 may be provided on the light emitting layer EML. The second light emitting element electrode LDE2 may be provided for each pixel PX, but may be provided to cover most of the display area DA and may be shared by the plurality of pixels PX.

The second light emitting element electrode LDE2 may be used as a cathode or an anode according to an embodiment. When the first light emitting element electrode LDE1 is the anode, the second light emitting element electrode LDE2 may be used as the cathode. When the first light emitting element electrode LDE1 is the cathode, the second light emitting element electrode LDE2 may be used as the anode.

The second light emitting element electrode LDE2 may be formed of a metal layer such as Ag, Mg, Al, Pt, Pd, Au, Ni, Nd, Ir or Cr, and/or a transparent conductive layer such as indium tin oxide (ITO), indium zinc oxide (IZO), zinc oxide (ZnO), or indium tin zinc oxide (ITZO). In an embodiment of the disclosure, the second light emitting element electrode LDE2 may be formed of multiple layers of two or more layers including a metal thin film, and for example, the second light emitting element electrode LDE2 may be formed of triple layers of ITO/Ag/ITO.

The second light emitting element electrode LDE2 may be formed of a metal reflective layer and/or a transparent conductive layer when an image is to be provided in a downward direction of the substrate SUB, and the second light emitting element electrode LDE2 may be formed of a transparent conductive layer when an image is to be provided in an upward direction of the substrate SUB.

A set of the first light emitting element electrode LDE1, the light emitting layer EML, and the second light emitting element electrode LDE2 may be referred to as a light emitting element.

The encapsulation layer TFE may be provided on the second light emitting element electrode LDE2. The encapsulation layer TFE may be formed of a single layer, but may also be formed of multiple layers. In the present embodiment, the encapsulation layer TFE may be formed of first to third encapsulation layers ENC1, ENC2, and ENC3. The first to third encapsulation layers ENC1, ENC2 and ENC3 may be formed of an organic material and/or an inorganic material. The third encapsulation layer ENC3 positioned at an outermost periphery may be formed of an inorganic material. For example, the first encapsulation layer ENC1 may be an inorganic layer formed of an inorganic material, the second encapsulation layer ENC2 may be an organic layer formed of an organic material, and the third encapsulation layer ENC3 may be an inorganic layer formed of an inorganic material. Penetration of moisture or oxygen to the inorganic material is less than that of the organic material. However, since elasticity or flexibility of the inorganic material is low, the inorganic material is vulnerable to a crack. Propagation of a crack may be prevented by forming the first encapsulation layer ENC1 and the third encapsulation layer ENC3 with the inorganic material and forming the second encapsulation layer ENC2 with the organic material.

Here, a layer formed of the organic material, that is, the second encapsulation layer ENC2, may be completely covered by the third encapsulation layer ENC3 so that an end is not exposed to the outside. As the organic material, an organic insulating material such as a polyacrylic compound, a polyimide compound, a fluorocarbon compound such as Teflon, or a benzocyclobutene compound may be used. As the inorganic material, polysiloxane, silicon nitride, silicon oxide, silicon oxynitride, or the like may be used.

The light emitting layer EML forming the light emitting element may be easily damaged by moisture or oxygen from the outside. The encapsulation layer TFE protects the light emitting elements by covering the light emitting layer EML. The encapsulation layer TFE may cover the display area DA and may extend to the non-display area NDA outside the display area DA. However, in a case of insulating layers formed of an organic material, there is an advantage in terms of flexibility, elasticity, or the like, but moisture and oxygen may be easily penetrated as compared to an insulating layer formed of an inorganic material. In an embodiment of the disclosure, in order to prevent penetration of moisture or oxygen through insulating layers formed of an organic material, the end of the insulating layers formed of the organic material may be covered by insulating layers formed of an inorganic material so as not to be exposed to the outside. For example, the first via layer VIA1, the second via layer VIA2, and the pixel defining layer PDL, which are formed of an organic material, do not extend continuously to the non-display area NDA, and may be covered by the first encapsulation layer ENC1. Therefore, an upper surface of the pixel defining layer PDL and sides of the first via layer VIA1, the second via layer VIA2, and the pixel defining layer PDL may be prevented from being exposed to the outside by being sealed by the encapsulation layer TFE including the inorganic material.

However, whether the encapsulation layer TFE is formed of a plurality of layers or a material of the encapsulation layer TFE is not limited thereto, and may be variously changed. For example, the encapsulation layer TFE may include a plurality of organic material layers and a plurality of inorganic material layers which are alternately stacked.

A first sensing electrode layer ISM1 may be positioned on the encapsulation layer TFE. According to an embodiment, an additional buffer layer may be positioned between the first sensing electrode layer ISM1 and the encapsulation layer TFE. The first sensing electrode layer ISM1 may be formed of a metal layer such as Ag, Mg, Al, Pt, Pd, Au, Ni, Nd, Ir or Cr, and/or a transparent conductive layer such as indium tin oxide (ITO), indium zinc oxide (IZO), zinc oxide (ZnO), or indium tin zinc oxide (ITZO).

The first sensing insulating layer ISI1 may exist on the first sensing electrode layer IMS1. The first sensing insulating layer ISI1 may be an inorganic insulating layer formed of an inorganic material. As the inorganic material, an inorganic insulating material such as polysiloxane, silicon nitride, silicon oxide, silicon oxynitride, or the like may be used.

A second sensing electrode layer ISM2 may be present on the first sensing insulating layer ISI1. The second sensing electrode layer ISM2 may be formed of a metal layer such as Ag, Mg, Al, Pt, Pd, Au, Ni, Nd, Ir or Cr, and/or a transparent conductive layer such as indium tin oxide (ITO), indium zinc oxide (IZO), zinc oxide (ZnO), or indium tin zinc oxide (ITZO).

A configuration of various input sensors using the first sensing electrode layer ISM1, the first sensing insulating layer ISI1, and the second sensing electrode layer ISM2 is described later with reference to FIGS. 5 to 7.

In the embodiment of FIG. 3, the second sensing electrode layer ISM2 may be patterned to form a first pattern IST1$a$ of the first sensing line IST1.

The second sensing insulating layer ISI2 may be positioned on the second sensing electrode layer ISM2. The second sensing insulating layer ISI2 may be configured of an organic layer. For example, as the organic material, an organic insulating material such as a polyacrylic compound, a polyimide compound, a fluorocarbon compound such as Teflon, or a benzocyclobutene compound may be used. For example, the second sensing insulating layer ISI2 may be formed of polymethyl methacrylate, polydimethylsiloxane, polyimide, acrylate, polyethylene terephthalate, polyethylene naphthalate, or the like.

Next, the non-display area NDA, the first additional area ADA1, and the second additional area ADA2 are described. Since distinction between the non-display area NDA and the first additional area ADA1 is not a characteristic in the cross-sectional view of FIG. 3, the non-display area NDA and the first additional area ADA1 are not separately described. Hereinafter, in describing the non-display area NDA and the second additional area ADA2, a previously described content is omitted or briefly described in order to avoid repetition of description.

A dam DAM may be positioned at a boundary of the second encapsulation layer ENC2. For example, the dam DAM may be positioned between a planarization layer FLT and the second encapsulation layer ENC2. The dam DAM may be a multiple layer structure and may include, for example, a first dam DAM1 and a second dam DAM2. For example, the first and second dams DAM1 and DAM2 may be formed of an organic material. Each of the first and second dams DAM1 and DAM2 may correspond to any one of the first via layer VIA1, the second via layer VIA2, and the pixel defining layer PDL. For example, when the first dam DAM1 is formed of the same material through the same process as the first via layer VIA1, the second dam DAM2 may be formed of the same material through the same process as the second via layer VIA2 or the pixel defining layer PDL. In another example, when the first dam DAM1 is formed of the same material through the same process as the second via layer VIA2, the second dam DAM2 may be formed of the same material through the same process as the pixel defining layer PDL. In addition, when a spacer is formed on the pixel defining layer PDL of the display area DA, the dam DAM may also be formed using the same material as the spacer.

The dam DAM prevents the organic material of the second encapsulation layer ENC2 of which fluidity is strong from overflowing to the outside of the dam DAM during a process. The first and third encapsulation layers ENC1 and ENC3 formed of the inorganic material may cover the dam DAM and extend, and thus adhesion to the substrate SUB or other layers on the substrate SUB may be increased.

The first pad PDE1 map be positioned on the substrate SUB, and may be spaced apart from the planarization layer FLT. The first pad PDE1 may be supported by a second insulating layer group ING2. Insulating layers of the second insulating layer group ING2 may correspond to insulating layers of the first insulating layer group ING1, respectively. The first pad PDE1 may include a first pad electrode PDE1$a$ and a second pad electrode PDE1$b$. The first pad electrode PDE1$a$ may be formed of the same material as the first connection pattern CNP1. The second pad electrode PDE1b may be formed of the same material as the second connection pattern CNP2.

The planarization layer FLT may be positioned on the substrate SUB, and may be spaced apart from an area covered by the encapsulation layer TFE. The planarization layer FLT may be an organic insulating layer formed of an organic material. As the organic material, an organic insulating material such as a polyacrylic compound, a polyimide compound, a fluorocarbon compound such as Teflon, a benzocyclobutene compound, or the like may be used.

In the present embodiment, the planarization layer FLT may be formed before the formation of the first connection pattern CNP1 after the formation of the interlayer insulating layer ILD. Therefore, the planarization layer FLT and the first via layer VIA1 may be formed through different processes. According to an embodiment, the planarization layer FLT and the first via layer VIA1 may include different organic materials.

One end of the planarization layer FLT may cover the first insulating layer group ING1. In addition, a portion of the planarization layer FLT corresponding to the second bending area BA2 may fill a first trench TCH1 between the first insulating layer group ING1 and the second insulating layer group ING2.

Since the inorganic insulating layers have rigidness higher and flexibility lower than those of the organic insulating layer, a probability of occurrence of a crack is relatively high. When the crack occurs in the inorganic insulating layers, the crack may propagate to lines on the inorganic insulating layers, and finally, a defect such as line disconnection or the like may be generated.

Therefore, as shown in FIG. 3, the first trench TCH1 may be formed by removing the inorganic insulating layers from the second bending area BA2, and the first insulating layer group ING1 and the second insulating layer group ING2 may be distinguished. In the present embodiment, all of the inorganic insulating layers corresponding to an area of the first trench TCH1 are removed, but in another embodiment, some inorganic insulating layers may be remained. In this case, the remained some inorganic insulating layers may include a slit to disperse a bending stress.

A second pattern IST1b of the first sensing line IST1 may extend on the planarization layer FLT and may be electrically connected to the first pad PDE1. In the present embodiment, the second pattern IST1b may be formed of the same material through the same process as the first connection pattern CNP1.

A first line protective layer LPL1 may cover the planarization layer FLT and the second pattern IST1b. In addition, a second line protective layer LPL2 may cover the first line protective layer LPL1. According to an embodiment, a configuration of the second line protective layer LPL2 may be omitted. The first- and second-line protective layers LPL1 and LPL2 may be formed of an organic material. Each of the first- and second-line protective layers LPL1 and LPL2 may correspond to any one of the first via layer VIA1, the second via layer VIA2, and the pixel defining layer PDL. For example, when the first line protective layer LPL1 is formed of the same material through the same process as the first via layer VIA1, the second line protective layer LPL2 may be formed of the same material through the same process as the second via layer VIA2 or the pixel defining layer PDL. In another example, when the first line protective layer LPL1 is formed of the same material through the same process as the second via layer VIA2, the second line protective layer LPL2 may be formed of the same material through the same process as the pixel defining layer PDL.

The first- and second-line protective layers LPL1 and LPL2 and the first sensing insulating layer ISI1 may include a first opening OPN1 that exposes the second pattern IST1b.

The first pattern IST1a may be connected to the second pattern IST1b through the first opening OPN1. According to the present embodiment, a height of the second pattern IST1b positioned on one end of the first insulating layer group ING1 and the planarization layer FLT may be greater than a height of the second pattern IST1b positioned on the planarization layer FLT corresponding to the first trench TCH1.

Therefore, the first pattern IST1a and the second pattern IST1b may be directly connected to each other without another bridge line. Since a bridge line is not present, connection reliability between the first pattern IST1a and the second pattern IST1b is improved. In addition, since a length of the non-display area NDA may be reduced by a length of the bridge line, a dead space is reduced and a thin bezel is easily implemented.

A third pattern IST1c of the first sensing line IST1 may connect the first pad PDE1 and the second pattern ISTb to each other. The third pattern IST1c may be formed of the same material through the same process as the gate electrode GE of the transistor. According to an embodiment, the third pattern IST1c may be formed of the same material through the same process as the upper electrode UE. According to an embodiment, odd-numbered third pattern IST1c may be formed of the same material through the same process as the gate electrode GE of the transistor and even-numbered third pattern IST1c may be formed of the same material through the same process as the upper electrode UE. On the contrary, the even-numbered third pattern IST1c may be formed of the same material through the same process as the gate electrode GE of the transistor and the odd-numbered third pattern IST1c may be formed of the same material through the same process as the upper electrode UE. Therefore, a problem of short circuit between adjacent lines may be more efficiently prevented.

The second insulating layer group ING2 may include a second opening OPN2 that exposes the third pattern IST1c. In addition, the planarization layer FLT may include an opening corresponding to the second opening OPN2. The second pattern IST1b may be connected to the third pattern IST1c through the second opening OPN2.

Figure 4:
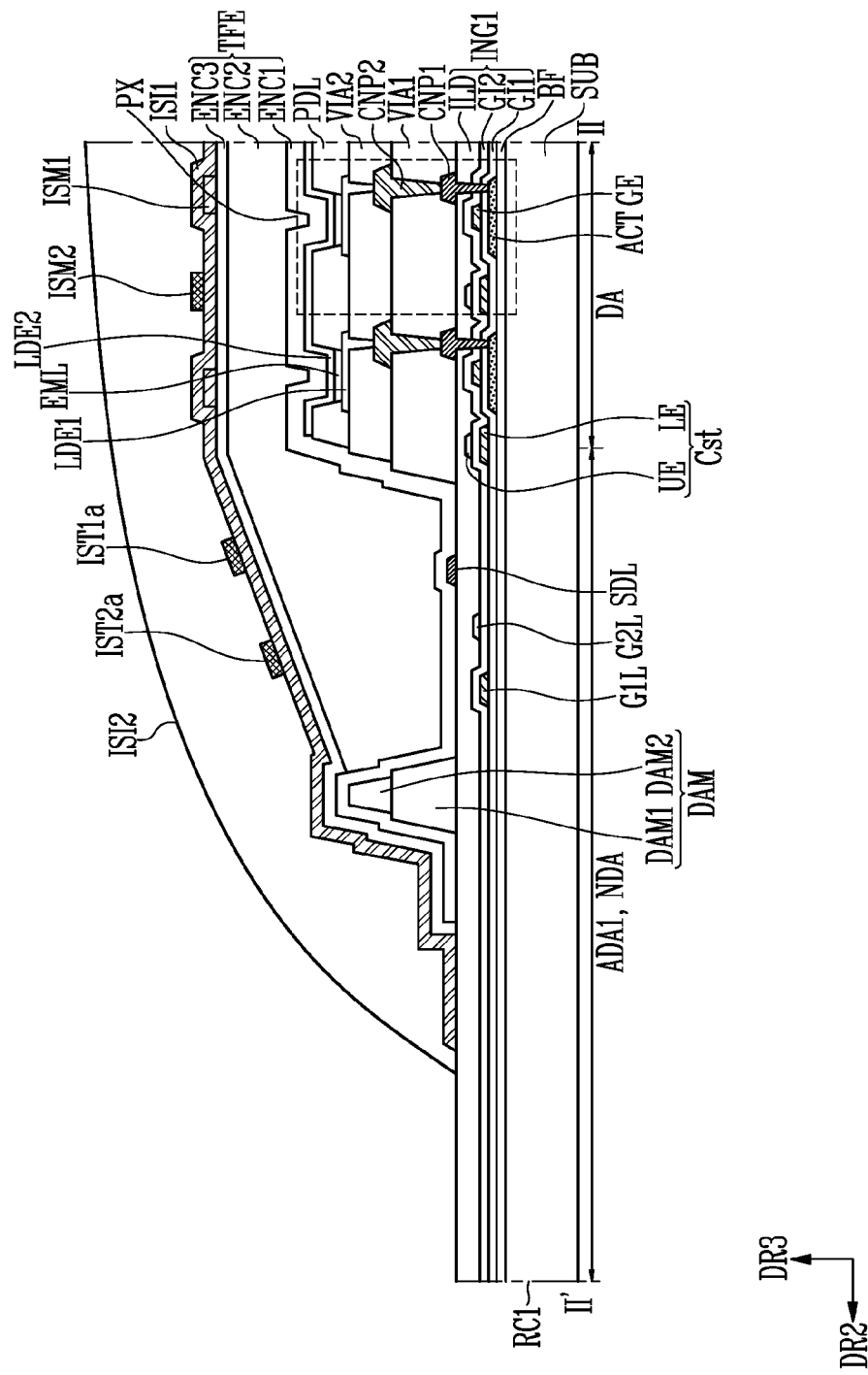

FIG. 4 is an embodiment of a cross-section taken along a line II-II' of FIG. 2.

The line II-I' of FIG. 2 may correspond to the first bending axis BX1. However, the same embodiment may be applied to the second side RC2 as well as the first side RC1.

The display lines DST may be configured of a single layer line or a multiple layer line using at least one of lines G1L, G2L, and SDL. The line G1L may be formed of the same material through the same process as the gate electrode GE. The line G2L may be formed of the same material through the same process as the upper electrode UE. The line SDL may be formed of the same material through the same process as the first connection pattern CNP1.

The patterns IST1a and IST12a of the sensing lines IST1 and IST2 may be positioned on the encapsulation layer TFE and the first sensing insulating layer ISI1 (in the third direction DR3) and may be positioned between the dam DAM and the display area DA (in the second direction DR2). The first sensing insulating layer ISI1 may be positioned between the encapsulation layer TFE and the sensing lines IST1 and IST2.

Figure 5:
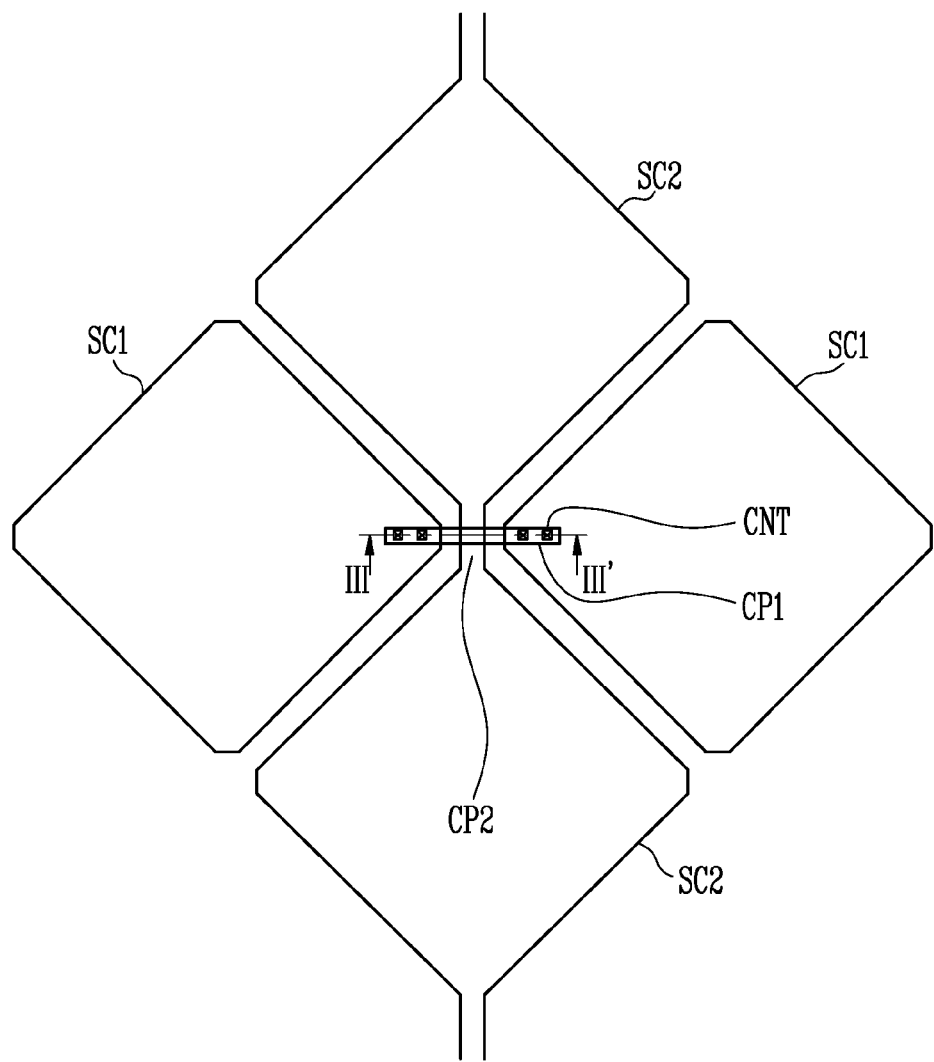
Figure 6:
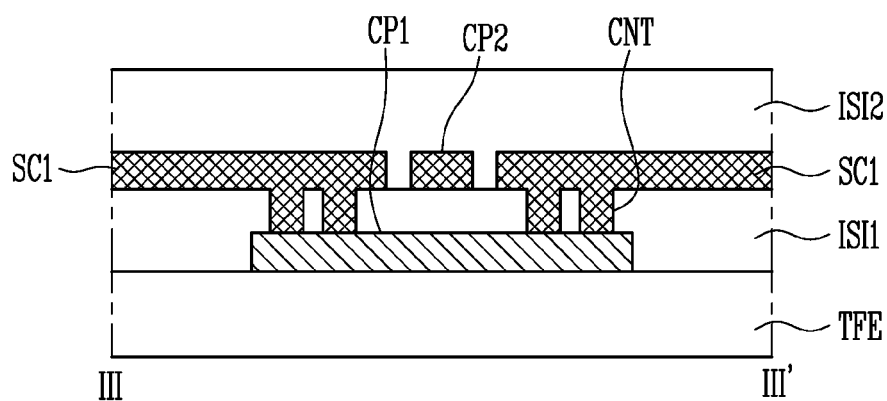

FIGS. 5 and 6 are diagrams illustrating sensing electrodes and bridge electrodes according to an embodiment of the disclosure. FIG. 6 is a cross-sectional view taken along a line III-III' of FIG. 5.

The bridge electrodes CP1 may be positioned on the encapsulation layer TFE by patterning the first sensing electrode layer ISM1.

The first sensing insulating layer ISI1 may cover the bridge electrode CP1 and may include contact holes CNT exposing a portion of the bridge electrodes CP1.

The first sensing electrodes SC1 and the second sensing electrodes SC2 may be formed on the first sensing insulating layer ISI1 by patterning the second sensing electrode layer ISM2. The first sensing electrodes SC1 may be connected to the bridge electrode CP1 through the contact holes CNT.

The second sensing electrodes SC2 may have a connection pattern CP2 in the same layer by patterning the second sensing electrode layer ISM2. Therefore, in connecting the second sensing electrodes SC2, a separate bridge electrode may be desirable.

According to an embodiment, each of the sensing electrodes SC1 and SC2 may cover the plurality of pixels PX. At this time, when each of the sensing electrodes SC1 and SC2 is configured of an opaque conductive layer, each of the sensing electrodes SC1 and SC2 may include a plurality of openings capable of exposing the plurality of covered pixels PX. For example, each of the sensing electrodes SC1 and SC2 may be configured in a mesh shape. When each of the sensing electrodes SC1 and SC2 is configured of a transparent conductive layer, each of the sensing electrodes SC1 and SC2 may be configured in a plate shape that does not include an opening.

Figure 7:
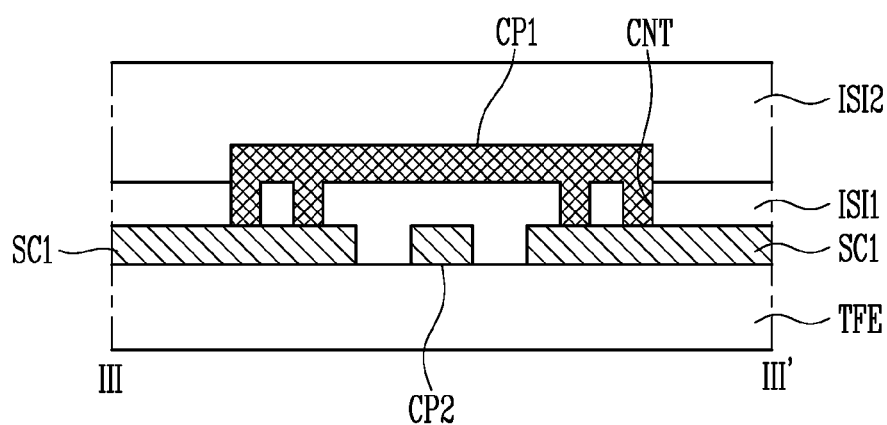

FIG. 7 is a diagram illustrating sensing electrodes and bridge electrodes according to another embodiment of the disclosure. FIG. 7 is another cross-sectional view taken along the line III-III' of FIG. 5.

The first sensing electrodes SC1 and the second sensing electrodes SC2 may be formed on the encapsulation layer TFE by patterning the first sensing electrode layer ISM1.

The first sensing insulating layer ISI1 may cover the first sensing electrodes SC1 and the second sensing electrodes SC2 and may include contact holes CNT exposing a portion of the first sensing electrodes SC1.

The bridge electrodes CP1 may be positioned on the first sensing insulating layer ISI1 by patterning the second sensing electrode layer ISM2. The bridge electrodes CP1 may be connected to the first sensing electrodes SC1 through the contact holes CNT.

Figure 8:
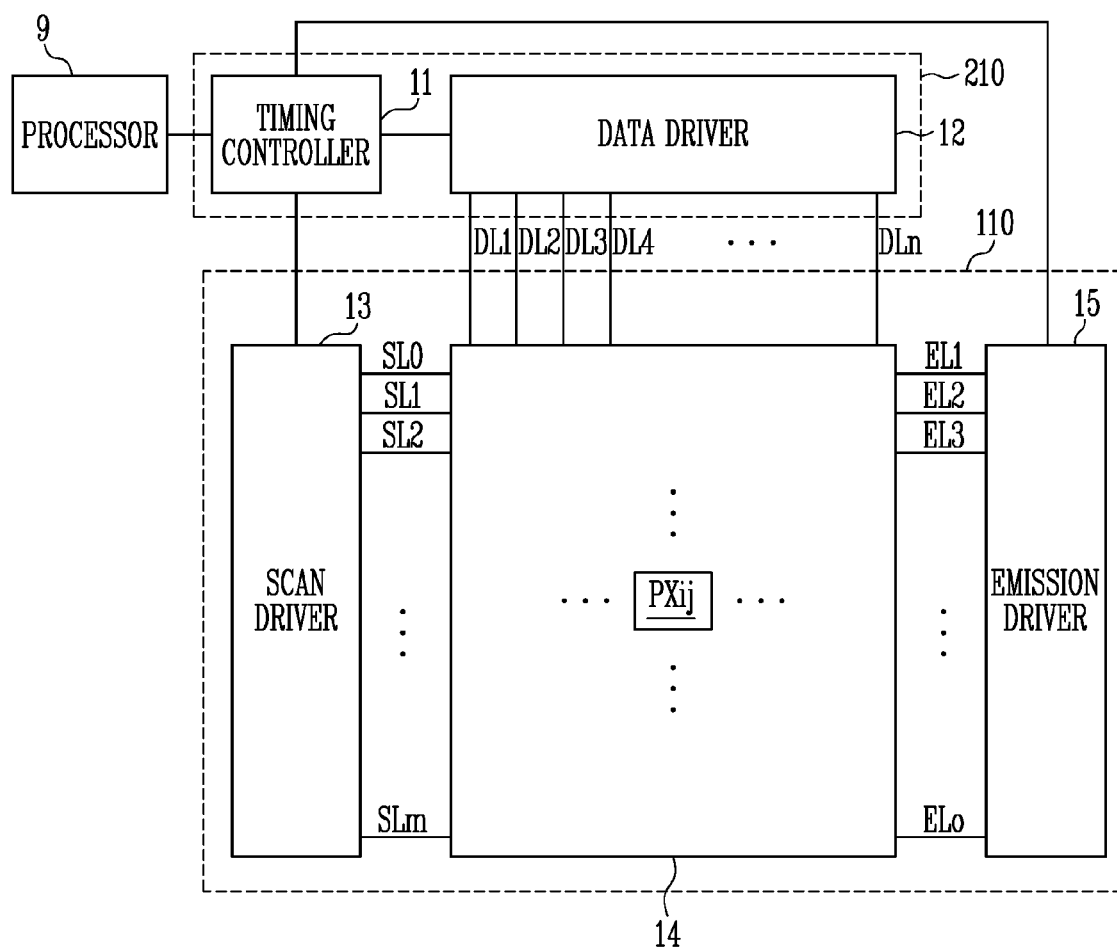
FIGS. 8 to 10 are diagrams illustrating a display device including a pixel according to an embodiment of the disclosure.
Figure 9:
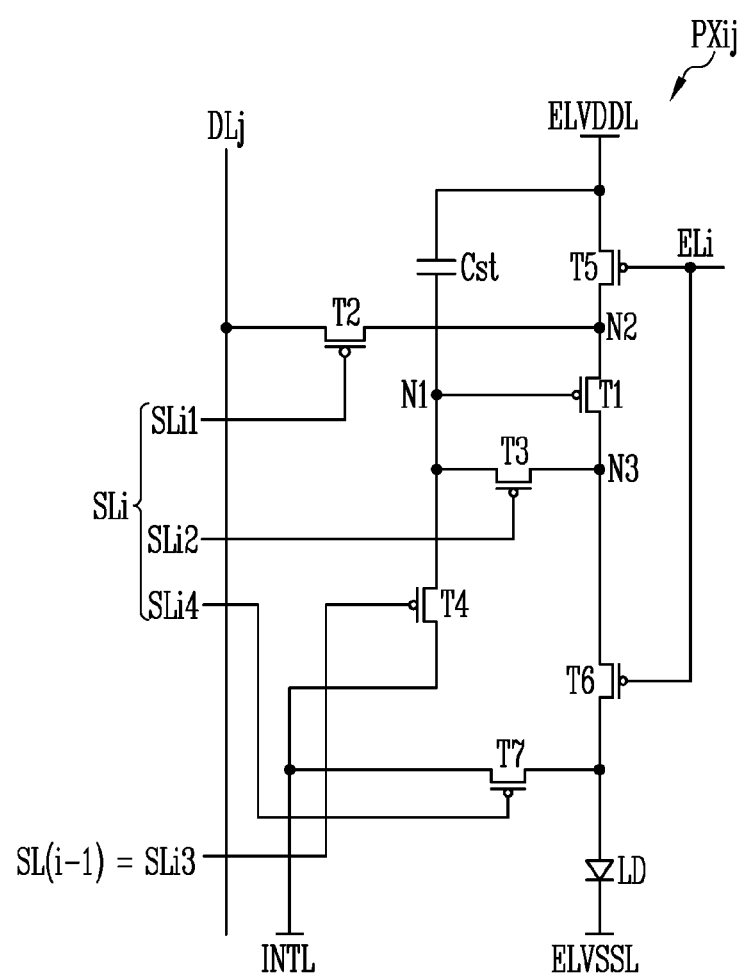
Figure 10:
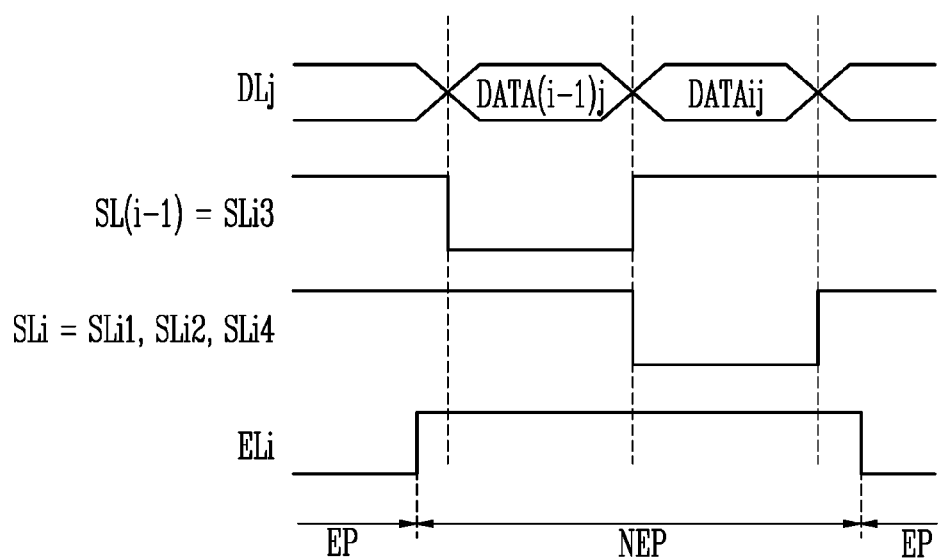

FIGS. 8 to 10 are diagrams illustrating a display device including a pixel according to an embodiment of the disclosure. FIG. 8 is a diagram illustrating a display unit and a display driver according to an embodiment of the disclosure.

Referring to FIG. 8, the display driver 210 may include a timing controller 11 and a data driver 12, and the display unit 110 may include a scan driver 13, a pixel unit 14, and an emission driver 15. However, as described above, whether each functional unit is integrated into one IC, integrated into a plurality of ICs, or mounted on a display substrate may be variously configured according to a specification of the display device 1.

The timing controller 11 may receive grayscales and timing signals for each display frame period from a processor 9. Here, the processor 9 may correspond to at least one of a graphics processing unit ("GPU"), a central processing unit ("CPU"), an application processor ("AP"), or the like.

The timing signals may include a vertical synchronization signal, a horizontal synchronization signal, a data enable signal, or the like.

Each cycle of the vertical synchronization signal may correspond to each display frame period. Each cycle of the horizontal synchronization signal may correspond to each horizontal period. The grayscales may be supplied in a horizontal line unit in each horizontal period in response to a pulse of an enable level of the data enable signal. A horizontal line may mean pixels (for example, a pixel row) connected to the same scan line and emission line.

The timing controller 11 may render the grayscales to correspond to the specification of the display device 1. For example, the processor 9 may provide a red grayscale, a green grayscale, and a blue grayscale for each unit dot. For example, when the pixel unit 14 has an RGB stripe structure, the pixel may correspond to each grayscale one-to-one. In this case, rendering of the grayscales may not be required. However, for example, when the pixel unit 14 has a PENTILE™ structure, since the pixel is shared between adjacent unit dots, the pixel may not correspond to each grayscale one-to-one. In this case, rendering of the grayscales may be desirable. The timing controller 11 may provide rendered or non-rendered grayscales as digital data signals to the data driver 12. For example, the digital data signal may have a structure of a bit string. In addition, the timing controller 11 may provide a data control signal to the data driver 12. In addition, the timing controller 11 may provide a scan control signal to the scan driver 13 and an emission control signal to the emission driver 15.

The data driver 12 may generate analog data voltages to be provided to data lines DL1, DL2, DL3, DL4, ..., and DLn by using the digital data signal and the data control signal received from the timing controller 11. n may be an integer greater than 0.

The scan driver 13 may generate scan signals to be provided to scan lines SL0, SL1, SL2, ..., and SLm by using the scan control signal (for example, a clock signal, a scan start signal, or the like) received from the timing controller 11. The scan driver 13 may sequentially supply scan signals having a pulse of a turn-on level to the scan lines SL0 to SLm. The scan driver 13 may include scan stages configured in a form of a shift register. The scan driver 13 may generate the scan signals in a method of sequentially transferring the scan start signal of a pulse form of a turn-on level to a next scan stage according to control of the clock signal. m may be an integer greater than 0.

The emission driver 15 may generate emission signals to be provided to emission lines EL1, EL2, EL3, ..., and ELo by using the emission control signal (for example, a clock signal, an emission stop signal, or the like) received from the timing controller 11. The emission driver 15 may sequentially supply emission signals having a pulse of a turn-off level to the emission lines EL1 to ELo. The emission driver 15 may include emission stages configured in a form of a shift register. The emission driver 15 may generate the emission signals in a method of sequentially transferring the emission stop signal of a pulse form of a turn-off level to a next emission stage according to control of the clock signal. o may be an integer greater than 0.

The pixel unit 14 includes pixels. Each pixel PXij may be connected to a corresponding data line, scan line, and emission line. The pixels may include pixels emitting light of a first color, pixels emitting light of a second color, and pixels emitting light of a third color. The first color, the second color, and the third color may be different colors. For example, the first color may be one color among red, green, and blue, the second color may be one color other than the first color among of red, green, and blue, and the third color may be a remaining color other than the first color and the second color among red, green, and blue. In addition, magenta, cyan, and yellow may be used instead of red, green, and blue as the first to third colors.

FIG. 9 is a diagram illustrating a pixel according to an embodiment of the disclosure.

Referring to FIG. 9, the pixel PXij includes transistors T1, T2, T3, T4, T5, T6, and T7, a storage capacitor Cst, and a light emitting element LD.

Hereinafter, a circuit configured of a P-type transistor is described as an example. However, those skilled in the art may design a circuit configured of an N-type transistor by differentiating a polarity of a voltage applied to a gate terminal. Similarly, those skilled in the art may design a circuit configured of a combination of a P-type transistor and an N-type transistor. The P-type transistor is collectively referred to as a transistor in which a current amount increases when a voltage difference between a gate electrode and a source electrode increases in a negative direction. The N-type transistor is collectively referred to as a transistor in which a current amount increases when a voltage difference between a gate electrode and a source electrode increases in a positive direction. The transistor may be configured in various forms such as a thin layer transistor ("TFT"), a field effect transistor ("FET"), and a bipolar junction transistor ("BJT").

The first transistor T1 may have a gate electrode connected to a first node N1, a first electrode connected to a second node N2, and a second electrode connected to a third node N3. The first transistor T1 may be referred to as a driving transistor.

The second transistor T2 may have a gate electrode connected to a scan line SLi1, a first electrode connected to a data line DLj, and a second electrode connected to the second node N2. The second transistor T2 may be referred to as a scan transistor.

The third transistor T3 may have a gate electrode connected to a scan line SLi2, a first electrode connected to the first node N1, and a second electrode connected to the third node N3. The third transistor T3 may be referred to as a diode-connection transistor.

The fourth transistor T4 may have a gate electrode connected to a scan line SLi3, a first electrode connected to the first node N1, and a second electrode connected to an initialization line INTL. The fourth transistor T4 may be referred to as a gate initialization transistor.

The fifth transistor T5 may have a gate electrode connected to an i-th emission line Ei, a first electrode connected to a first power line ELVDDL, and a second electrode connected to the second node N2. The fifth transistor T5 may be referred to as an emission transistor. In another embodiment, the gate electrode of the fifth transistor T5 may be connected to an emission line different from an emission line connected to a gate electrode of the sixth transistor T6.

The sixth transistor T6 may have the gate electrode connected to the i-th emission line Ei, a first electrode connected to the third node N3, and a second electrode connected to an anode of the light emitting element LD. The sixth transistor T6 may be referred to as an emission transistor. In another embodiment, the gate electrode of the sixth transistor T6 may be connected to the emission line different from the emission line connected to the gate electrode of the fifth transistor T5.

The seventh transistor T7 may have a gate electrode connected to a scan line SLi4, a first electrode connected to the initialization line INTL, and a second electrode connected to the anode of the light emitting element LD. The seventh transistor T7 may be referred to as a light emitting element initialization transistor.

A first electrode of the storage capacitor Cst may be connected to the first power line ELVDDL and a second electrode may be connected to the first node N1.

The anode of the light emitting element LD may be connected to the second electrode of the sixth transistor T6 and a cathode may be connected to a second power line ELVSSL. The light emitting element LD may be a light emitting diode. The light emitting element may be configured of an organic light emitting element (organic light emitting diode), an inorganic light emitting element (inorganic light emitting diode), a quantum dot/well light emitting element (quantum dot/well light emitting diode), or the like. The light emitting element LD may emit light in any one color among the first color, the second color, and the third color. In addition, although only one light emitting element LD is provided in each pixel in the present embodiment, a plurality of light emitting elements may be provided in each pixel in another embodiment. At this time, the plurality of light emitting elements may be connected in series, parallel, series-parallel, or the like.

A first power voltage may be applied to the first power line ELVDDL, a second power voltage may be applied to the second power line ELVSSL, and an initialization voltage may be applied to the initialization line INTL. For example, the first power voltage may be greater than the second power voltage. For example, the initialization voltage may be equal to or greater than the second power voltage. For example, the initialization voltage may correspond to the smallest analog data voltage among the analog data voltages that may be provided. In another example, a magnitude of the initialization voltage may be less than magnitudes of the analog data voltages that may be provided.

FIG. 10 is a diagram illustrating an exemplary driving method of the pixel of FIG. 9.

Hereinafter, for convenience of description, it is assumed that the scan lines SLi1, SLi2, and SLi4 are an i-th scan line SLi and the scan line SLi3 is an (i−1)-th scan line SL(i−1). However, a connection relationship between the scan lines SLi1, SLi2, SLi3, and SLi4 may be various according to embodiments. For example, the scan line SLi4 may be the (i−1)-th scan line or an (i+1)-th scan line.

First, an emission signal of a turn-off level (logic high level) is applied to an i-th emission line EL1, an analog data voltage DATA(i−1)j for the (i−1)-th pixel is applied to a data line DLj, and a scan signal of a turn-on level (logic low level) is applied to the scan line SLi3. High/low of the logic level may vary according to whether the transistor is a P-type or an N-type At this time, since a scan signal of a turn-off level is applied to the scan lines SLi1 and SLi2, the second transistor T2 is turned off and the analog data voltage DATA(i−1)j is prevented from being input to the pixel PXij.

At this time, since the fourth transistor T4 is turned on, the first node N1 is connected to the initialization line INTL, and a voltage of the first node N1 is initialized. Since the emission signal of the turn-off level is applied to the emission line EL1, the transistors T5 and T6 are turned off, and light emission of an unnecessary light emitting element LD according to an initialization voltage application process is prevented.

Next, an analog data voltage DATAij for the i-th pixel PXij is applied to the data line DLj, and the scan signal of the turn-on level is applied to the scan lines SLi1 and SLi2.

Accordingly, the transistors T2, T1, and T3 are turned on, and the data line DLj and the first node N1 are electrically connected to each other. Therefore, a compensation voltage obtained by subtracting a threshold voltage of the first transistor T1 from the analog data voltage DATAij is applied to the second electrode of the storage capacitor Cst (that is, the first node N1), and the storage capacitor Cst maintains a voltage corresponding to a difference between the first power voltage and the compensation voltage. Such a period may be referred to as a threshold voltage compensation period or a data writing period.

In addition, when the scan line SLi4 is the i-th scan line, since the seventh transistor T7 is turned on, the anode of the light emitting element LD and the initialization line INTL are connected to each other, and the light emitting element LD is initialized to a charge amount corresponding to a voltage difference between the initialization voltage and the second power voltage.

Thereafter, as an emission signal of a turn-on level is applied to the emission line EL1, the transistors T5 and T6 may be turned on. Therefore, a driving current path connecting the first power line ELVDDL, the fifth transistor T5, the first transistor T1, the sixth transistor T6, the light emitting element LD, and the second power line ELVSSL is formed.

A driving current amount flowing through the first electrode and the second electrode of the first transistor T1 is adjusted according to the voltage maintained in the storage capacitor Cst. The light emitting element LD emits light with a luminance corresponding to the driving current amount. The light emitting element LD emits light until the emission signal of the turn-off level is applied to the emission line EL1.

When the emission signal is at the turn-on level, pixels receiving the corresponding emission signal may be in a display state. Therefore, a period in which the emission signal is at the turn-on level may be referred to as an emission period EP (or an emission allowable period). In addition, when the emission signal is at the turn-off level, pixels receiving the corresponding emission signal may be in a non-display state. Therefore, a period in which the emission signal is at the turn-off level may be referred to as a non-emission period NEP (or an emission disallowable period).

The non-emission period NEP described with reference to FIG. is for preventing the pixel PXij from emitting light with an undesirable luminance during the initialization period and the data writing period.

One or more non-emission periods NEP may be additionally provided while data written in the pixel PXij is maintained (for example, one frame period). This may be for effectively expressing a low grayscale by reducing the emission period EP of the pixel PXij or for smoothly blurring motion of an image.

Figure 11A:
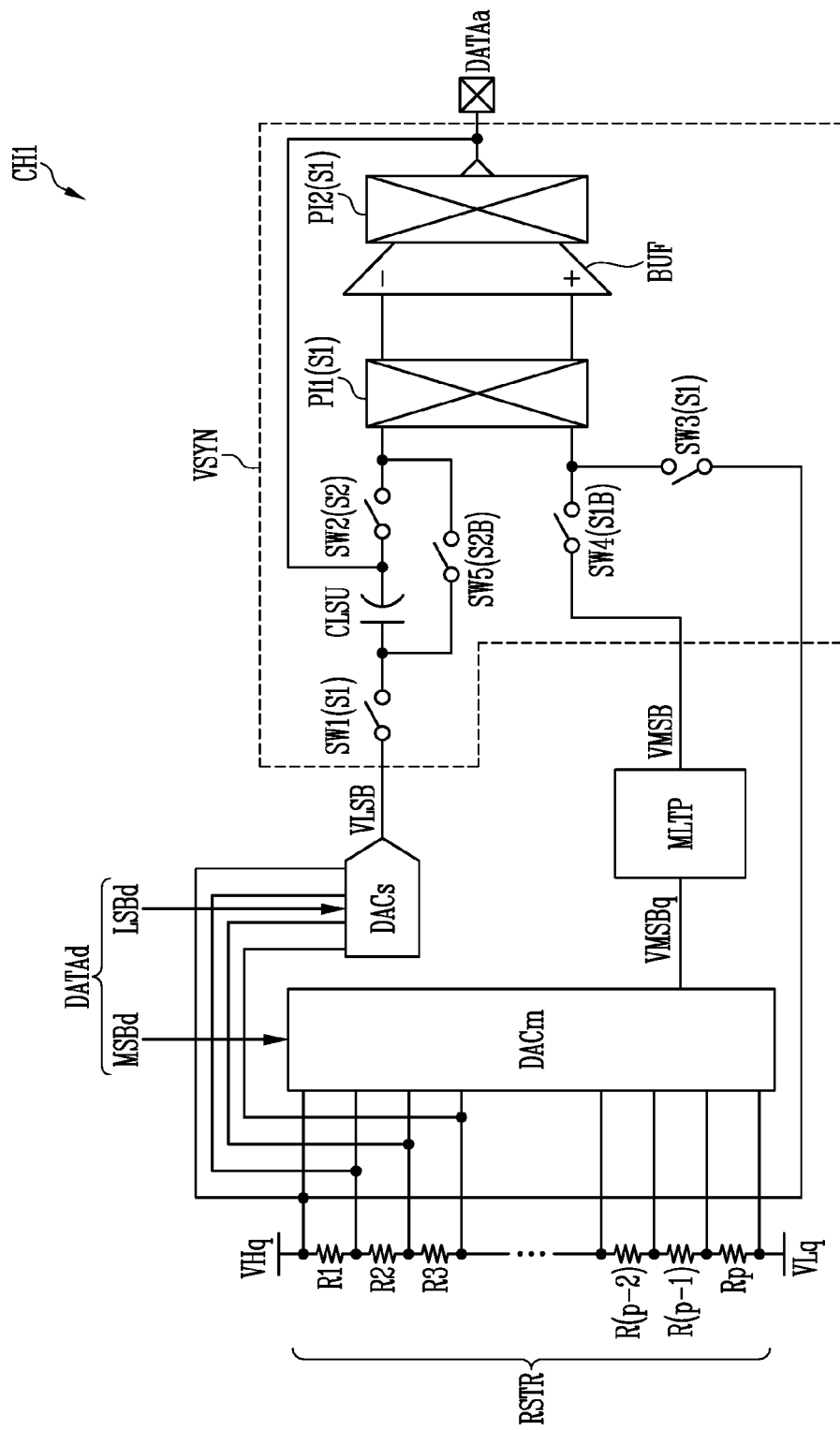
FIGS. 11A and 11B are diagrams illustrating a data channel of a data driver according to each embodiment of the disclosure.
Figure 11B:
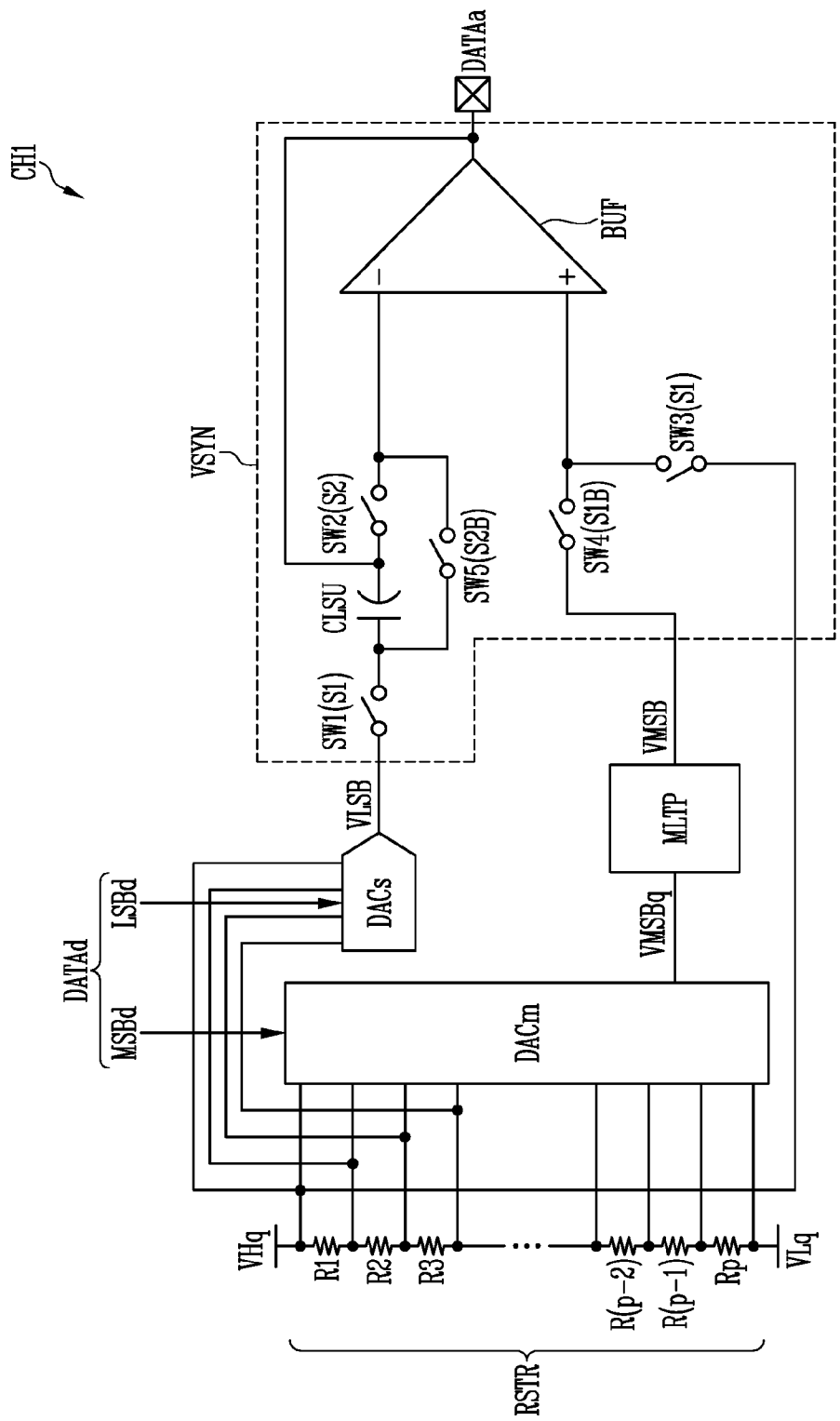

FIGS. 11A and 11B are diagrams illustrating a data channel of a data driver according to each embodiment of the disclosure.

The data driver 12 according to an embodiment of the disclosure may include a resistor string RSTR and a plurality of data channels. Referring to FIGS. 11A and 11B, a data channel CH1 that is one of the plurality of data channels is illustrated. Since other data channels may also be configured identically to the data channel CH1, a repetitive description of the other data channels is omitted.

In an embodiment, the plurality of data channels may share the resistor string RSTR. That is, respective nodes of one resistor string RSTR may be commonly connected to the plurality of data channels. In another embodiment, the data driver 12 may include a first resistor string for the first color (for example, red), a second resistor string for the second color (for example, green), and a third resistor string for the third color (for example, blue). In this case, first data channels for supplying an analog data voltage for the first color among the plurality of data channels may be commonly connected to respective nodes of the first resistor string. Second data channels for supplying an analog data voltage for the second color among the plurality of data channels may be commonly connected to respective nodes of the second resistor string. Third data channels for supplying an analog data voltage for the third color among the plurality of data channels may be commonly connected to respective nodes of the third resistor string. In another embodiment, each of the plurality of data channels may individually include the resistor string RSTR.

In the resistor string RSTR, a plurality of resistors R1, R2, R3, ..., R(p−2), R(p−1), and Rp may be connected in series. For example, resistance values of the plurality of resistors R1 to Rp may be the same. In this case, magnitudes of voltages distributed to the plurality of resistors R1 to Rp may be the same.

A high voltage VHq may be applied to a high voltage node of the resistor string RSTR. In FIGS. 11A and 11B, the high voltage node corresponds to a first electrode of the resistor R1. A low voltage VLq may be applied to a low voltage node of the resistor string RSTR. In FIGS. 11A and 11B, the low voltage node corresponds to a second electrode of the resistor Rp. Nodes except for the high voltage node and the low voltage node of the resistor string RSTR are defined as intermediate voltage nodes. The intermediate voltage nodes may be points where adjacent resistors are connected to each other.

The data channel CH1 may be connected to the high voltage node, the intermediate voltage nodes, and the low voltage node of the resistor string RSTR, and may convert a digital data signal DATAd into an analog data voltage DATAa.

The data channel CH1 according to an embodiment of the disclosure may include a main digital-to-analog converter DACm, a multiplier MLTP, a sub digital-to-analog converter DACs, and a voltage synthesizer VSYN.

The main digital-to-analog converter DACm may be connected to the high voltage node, the intermediate voltage nodes, and the low voltage node of the resistor string RSTR. The main digital-to-analog converter DACm may output a voltage VMSBq corresponding to a first control signal among voltages received from the high voltage node, the intermediate voltage nodes, and the low voltage node to an output terminal. The first control signal may correspond to a most significant bits (MSB) MSBd of the digital data signal DATAd.

An input terminal of the multiplier MLTP may be connected to the output terminal of the main digital-to-analog converter DACm. The multiplier MLTP may output a voltage VMSB corresponding to the MSB MSBd of the digital data signal DATAd. At this time, the output voltage VMSB may correspond to N times an input voltage VMSBq. Here, N may be an integer greater than 1. Hereinafter, it is assumed that N is 4 for convenience of description.

The sub digital-to-analog converter DACs may be connected to some of the high voltage node, the intermediate voltage nodes, and the low voltage node of the resistor string RSTR. That is, the number of nodes of the resistor string RSTR to which the sub digital-to-analog converter DACs is connected is less than the number of nodes of the resistor string RSTR to which the main digital-to-analog converter DACm is connected. The sub digital-to-analog converter DACs may output a voltage VLSB corresponding to a second control signal among voltages received from the connected nodes to an output terminal. The second control signal may correspond to a least significant bit (LSB) LSBd of the digital data signal DATAd. That is, the sub digital-to-analog converter DAC may output the voltage VLSB corresponding to the LSB LSBd of the digital data signal DATAd.

In an embodiment, for example, it is assumed that the digital data signal DATAd is a bit string configured of M bits. At this time, when the LSB LSBd of the digital data signal DATAd is configured of s bits (lower bits), the MSB MSBd of the digital data signal DATAd is configured of M bits (higher bits). In the embodiment of FIGS. 11A and 11B, it is assumed that s is 2 and M is 10. Therefore, input terminals of the sub digital-to-analog converter DACs are shown to be connected to four (4=2^2) of the nodes of the resistor string RSTR. For example, the input terminals of the sub digital-to-analog converter DACs may be connected to one high voltage node and three intermediate voltage nodes of the resistor string RSTR. At this time, one high voltage node and three intermediate voltage nodes may be nodes corresponding to a voltage level at which an amplifier BUF is operable. At this time, the nodes to which the input terminals of the sub digital-to-analog converter DACs are connected may be the most adjacent nodes without other nodes in the middle. That is, the three intermediate voltage nodes may be three most adjacent nodes to the high voltage node among the intermediate voltage nodes.

Input terminals of the voltage synthesizer VSYN may be connected to an output terminal of the multiplier MLTP and the output terminal of the sub digital-to-analog converter DACs. The voltage synthesizer VSYN may generate the analog data voltage DATAa by synthesizing the output voltage VMSB of the multiplier MLTP and the output voltage VLSB of the sub digital-to-analog converter DACs.

The voltage synthesizer VSYN of the embodiment of FIG. 11A may include a sampling capacitor CLSU, first to fifth switches SW1 to SW5, the amplifier BUF, a first offset inverter PI1, and a second offset inverter PI2. The voltage synthesizer VSYN of the embodiment of FIG. 11B may not include the first offset inverter PI1 and the second offset inverter PI2. The first offset inverter PI1 and the second offset inverter PI2 are means (e.g., circuits) for detecting and canceling an input offset voltage of the amplifier BUF. The voltage synthesizer VSYN may not include the first offset inverter PI1 and the second offset inverter PI2 when the input offset voltage may be ignored or canceled in other methods (FIG. 11B).

A first input terminal (for example, an inverting terminal) of the amplifier BUF may be connected to the second switch SW2, and a second input terminal (for example, a non-inverting terminal) may be connected to the third switch SW3 and the fourth switch SW4. An output terminal of the amplifier BUF may be connected to a second electrode of the sampling capacitor CLSU.

The first switch SW1 may connect the output terminal of the sub digital-to-analog converter DACs and a first electrode of the sampling capacitor CLSU. The second switch SW2 may connect the second electrode of the sampling capacitor CLSU and the first input terminal of the amplifier BUF.

The third switch SW3 may connect one of the high voltage node, the intermediate voltage nodes, and the low voltage node of the resistor string RSTR to the second input terminal of the amplifier BUF. In the embodiment of FIGS. 11A and 11B, the third switch SW3 may connect the high voltage node and the second input terminal of the amplifier BUF. A node of the resistor string RSTR to which the third switch SW3 is connected may be the same as a node corresponding to the highest voltage VHq among nodes to which the input terminals of the sub digital-to-analog converter DACs are connected.

The fourth switch SW4 may connect the output terminal of the multiplier MLTP and the second input terminal of the amplifier BUF. The fifth switch SW5 may connect the first electrode of the sampling capacitor CLSU and the first input terminal of the amplifier BUF.

The first switch SW1 and the third switch SW3 may be turned on when receiving a first switching signal S1. The fourth switch SW4 may be turned on when receiving an inverted signal S1B of the first switching signal S1. The second switch SW2 may be turned on when receiving a second switching signal S2. The fifth switch SW5 may be turned on when receiving an inverted signal S2B of the second switching signal S2.

As described above, the data channel CH1 of the embodiment of FIG. 11A may include the first offset inverter PI1 and the second offset inverter PI2. The first offset inverter PI1 may connect the second switch SW2, to one of the first input terminal of the amplifier BUF and the second input terminal of the amplifier BUF and connect the third switch SW3 to the other one of the first input terminal of the amplifier BUF and the second input terminal of the amplifier BUF. The second offset inverter PI2 may be positioned inside the amplifier BUF, and may be connected between the first input terminal and the second input terminal of the amplifier BUF. When receiving the first switching signal S1, the first offset inverter PI1 and the second offset inverter PI2 may invert the input offset voltage of the amplifier BUF and apply the input offset voltage to the second electrode of the sampling capacitor CLSU. A detailed content thereof refers to a description of FIG. 14.

Figure 12:
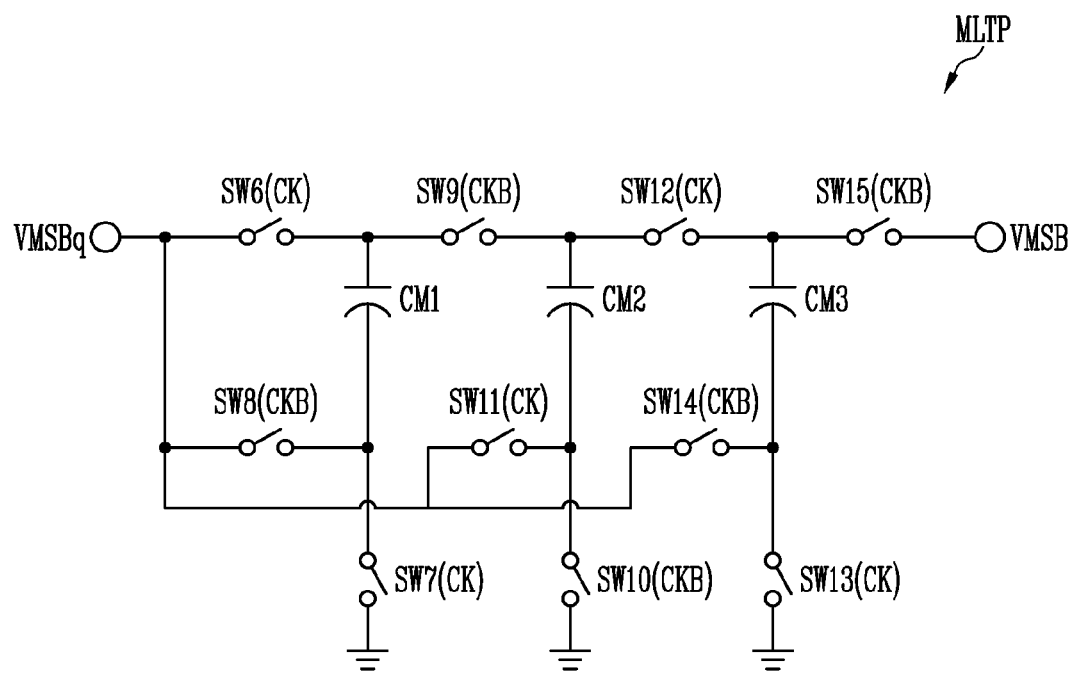
FIGS. 12 and 13 are diagrams illustrating a multiplier according to an embodiment of the disclosure.
Figure 13:
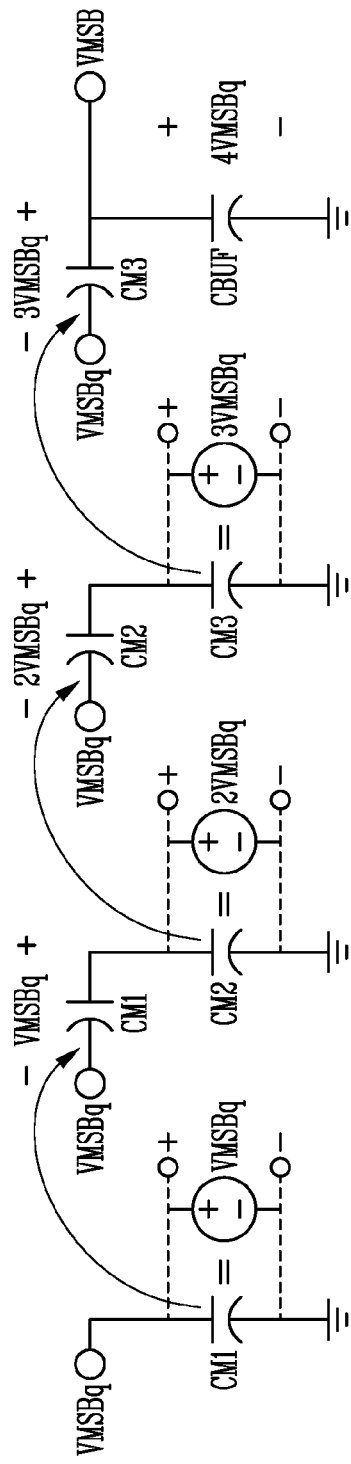

FIGS. 12 and 13 are diagrams illustrating a multiplier according to an embodiment of the disclosure.

The multiplier MLTP may output the output voltage VMSB corresponding to N times the input voltage VMSBq. The multiplier MLTP may include (N−1) capacitors CM1, CM2, and CM3. N may be an integer greater than 1. A variable N and a variable s indicating the number of LSB LSBd may have a relationship as shown in Equation 1 below.

$$N=2^s \qquad \text{[Equation 1]}$$

Since s is assumed to be 2, N is assumed to be 4 hereinafter.

The multiplier MLTP may include sixth to fifteenth switches SW6 to SW15. The sixth switch SW6 may connect the input terminal of the multiplier MLTP and a first electrode of the first capacitor CM1. The seventh switch SW7 may connect a second electrode of the first capacitor CM1 and reference power (for example, ground). The eighth switch SW8 may connect the second electrode of the first capacitor CM1 and the input terminal of the multiplier MLTP. The ninth switch SW9 may connect the first electrode of the first capacitor CM1 and a first electrode of the second capacitor CM2. The tenth switch SW10 may connect a second electrode of the second capacitor CM2 and the reference power. The eleventh switch SW11 may connect the second electrode of the second capacitor CM2 and the input terminal of the multiplier MLTP. The twelfth switch SW12 may connect the first electrode of the second capacitor CM2 and a first electrode of the third capacitor CM3. The thirteenth switch SW13 may connect a second electrode of the third capacitor CM3 and the reference power. The fourteenth switch SW14 may connect the second electrode of the third capacitor CM3 and the input terminal of the multiplier MLTP. The fifteenth switch SW15 may connect the first electrode of the third capacitor CM3 and the output terminal of the multiplier MLTP.

In an embodiment, for example, the multiplier MLTP may receive a clock signal for controlling the sixth to fifteenth switches SW6 to SW15. For example, the sixth, seventh, eleventh, twelfth, and thirteenth switches SW6, SW7, SW11, SW12, and SW13 may be turned on when the clock signal is a first logic level CK. The eighth, ninth, tenth, fourteenth, and fifteenth switches SW8, SW9, SW10, SW14, and SW15 may be turned on when the clock signal is a second logic level CKB different from the first logic level CK.

Referring to FIGS. 12 and 13, when the clock signal of the first logic level CK is input to the multiplier MLTP, the sixth switch SW6 and the seventh switch SW7 are turned on. At this time, the first electrode of the first capacitor CM1 receives the input voltage VMSBq, and the second electrode of the first capacitor CM1 is connected to the reference power. When the reference power is the ground voltage, a voltage stored in the first capacitor CM1 becomes equal to the input voltage VMSBq.

Next, when the clock signal input to the multiplier MLTP is transited to the second logic level CKB, the eighth switch SW8, the ninth switch SW9, and the tenth switch SW10 are turned on. At this time, the first electrode of the second capacitor CM2 receives a voltage 2VMSBq corresponding to a sum of the input voltage VMSBq and the voltage stored in the first capacitor CM1. The second electrode of the second capacitor CM2 is connected to the reference power. Therefore, a voltage stored in the second capacitor CM2 corresponds to twice the input voltage VMSBq.

Next, when the clock signal input to the multiplier MLTP is transited to the first logic level CK again, the eleventh switch SW11, the twelfth switch SW12, and the thirteenth switch SW13 are turned on. At this time, the first electrode of the third capacitor CM3 receives a voltage 3VMSBq corresponding to a sum of the input voltage VMSBq and the voltage stored in the second capacitor CM2. The second electrode of the third capacitor CM3 is connected to the reference power. Therefore, a voltage stored in the third capacitor CM3 corresponds to three times the input voltage VMSBq.

Next, when the clock signal input to the multiplier MLTP is transited to the second logic level CKB again, the fourteenth switch SW14 and the fifteenth switch SW15 are turned on. At this time, a first electrode of a capacitor CBUF of the amplifier BUF receives a voltage 4VMSBq corresponding to a sum of the input voltage VMSBq and the voltage stored in the third capacitor CM3. A second electrode of the capacitor CBUF is connected to the reference power. Therefore, a voltage stored in the capacitor CBUF of the amplifier BUF corresponds to four times the input voltage VMSBq.

That is, according to the present embodiment, the multiplier MLTP may generate the output voltage VMSB corresponding to four times the input voltage VMSBq. However, as described above, this is a case where N is assumed to be 4, and N may be set differently. The multiplier MLTP of the present embodiment has advantages that the multiplier MLTP is insensitive to a size, a ratio, and mismatch of the capacitors CM1, CM2, CM3, and CBUF, and is capable of generating an output voltage of a constant magnification (that is, gain).

Figure 14:
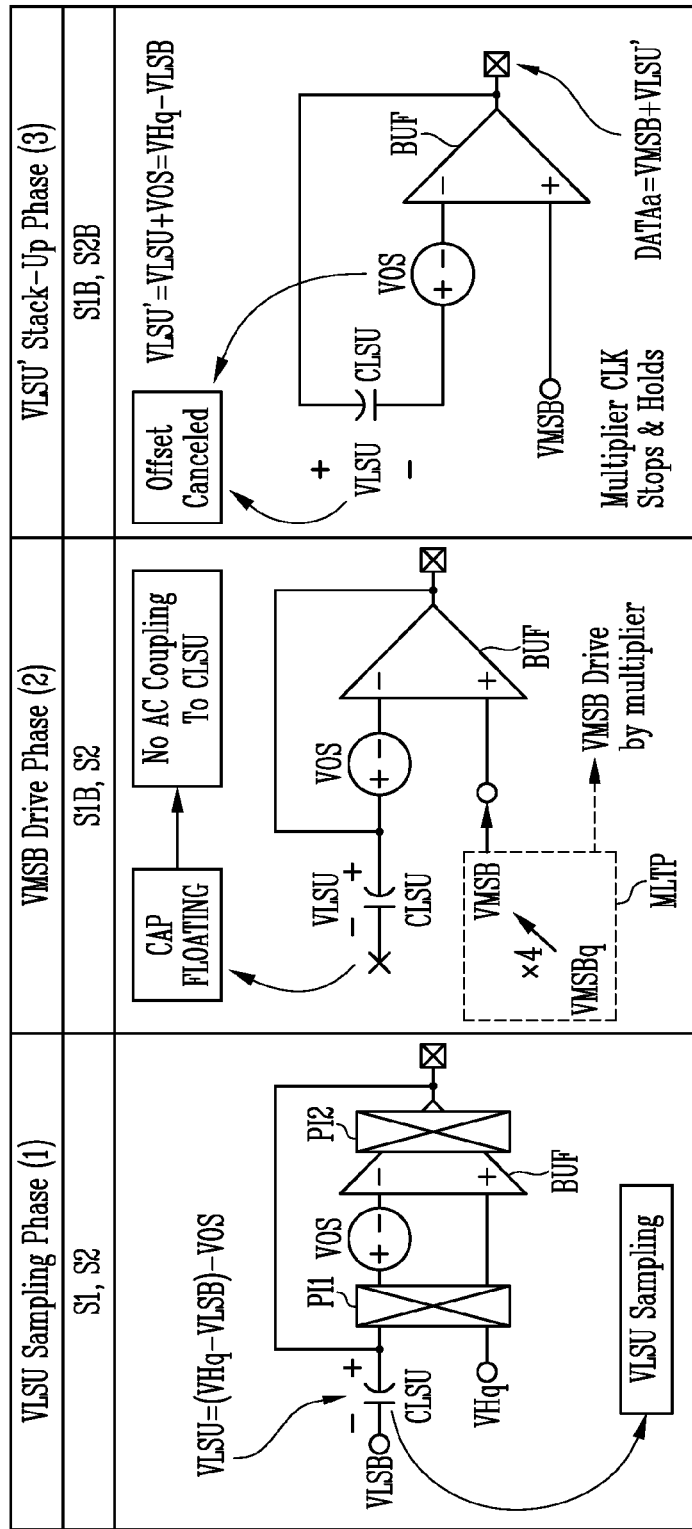
FIG. 14 is a diagram illustrating an operation of a voltage synthesizer according to an embodiment of the disclosure.

FIG. 14 is a diagram illustrating an operation of a voltage synthesizer according to an embodiment of the disclosure.

Referring to FIGS. 11A and 14, when the first switching signal S1 and the second switching signal S2 are received, a first phase of sampling a voltage VLSU to the sampling capacitor CLSU is performed. At this time, the first switch SW1, the second switch SW2, and the third switch SW3 are in a turn-on state, and the fourth switch SW4 and the fifth switch SW5 are in a turn-off state.

Since the first switch SW1 is in the turn-on state, the output voltage VLSB of the sub digital-to-analog converter DACs is applied to a first electrode of the sampling capacitor CLSU. Since the third switch SW3 is in the turn-on state, a voltage VHq of the high voltage node of the resistor string RSTR is applied to the second input terminal of the amplifier BUF.

As described above, when receiving the first switching signal S1, the first offset inverter PI1 and the second offset inverter PI2 may invert the input offset voltage VOS of the amplifier BUF and apply the input offset voltage VOS to a second electrode of the capacitor CLSU. The input offset voltage VOS shown in FIG. 14 is not an actual voltage source, but a virtual voltage source shown for convenience of description. When the first offset inverter PI1 receives the first switching signal S1, the first offset inverter PI1 exchange a signal to be input to the first input terminal of the amplifier BUF and a signal to be input to the second input terminal of the amplifier BUF outside the amplifier BUF (that is, not affected by the input offset voltage VOS). When the second offset inverter PI2 receives the first switching signal S1, the second offset inverter PI2 exchanges the signal to be input to the first input terminal of the amplifier BUF and the signal to be input to the second input terminal of the amplifier BUF inside the amplifier BUF (that is, affected by the input offset voltage VOS). Therefore, a positive voltage VHq inverted twice and a negative input offset voltage VOS inverted once are applied to the second electrode of the sampling capacitor CLSU. Therefore, the voltage VLSU stored in the sampling capacitor CLSU in the first phase is as shown in Equation 2 below.

$$VLSU=(VHq-VLSB)-VOS \qquad \text{[Equation 2]}$$

Next, in a second phase (VMSB driver phase), the inverted signal S1B of the first switching signal S1 and the second switching signal S2 are received. At this time, the second switch SW2 and the fourth switch SW4 are in the turn-on state, and the first switch SW1, the third switch SW3, and the fifth switch SW5 are in the turn-off state. The first offset inverter PI1 and the second offset inverter PI2 do not operate. A case where the first offset inverter PI1 and the second offset inverter PI2 do not operate means that a direction of input signals is not changed. Therefore, as shown in FIG. 14, in circuit analysis, it may be illustrated that the first offset inverter PI1 and the second offset inverter PI2 do not exist.

The output voltage VMSB of the multiplier MLTP is input to the second input terminal of the amplifier BUF. At this time, the first electrode of the sampling capacitor CLSU is in a floating state, and thus the sampling capacitor CLSU maintains the stored voltage VLSU.

Next, in a third phase (VLSU stack-up phase), the inverted signal S1B of the first switching signal S1 and the inverted signal S2B of the second switching signal S2 are received. At this time, the fourth switch SW4 and the fifth switch SW5 are in the turn-on state, and the first switch SW1, the second switch SW2, and the third switch SW3 are in the turn-off state. The first offset inverter PI1 and the second offset inverter PI2 do not operate.

At this time, an input offset component of the voltage VLSU stored in the sampling capacitor CLSU and the input offset voltage VOS of the amplifier BUF may be offset from each other. Such an offset voltage VLSU' may include only a voltage VHq-VLSB corresponding to the LSB LSBd of the digital data signal DATAd.

Assuming that the amplifier BUF is an ideal operational amplifier ("OP-AMP"), a voltage of the inverting terminal (that is, the first input terminal) of the amplifier BUF is equal to the voltage VMSB of the non-inverting terminal (that is, the second input terminal), and thus the output voltage DATAa of the amplifier BUF satisfies Equation 3 below.

$$DATAa = VMSB + VLSU'$$  [Equation 3]

That is, the analog data voltage DATAa is equal to a sum of the voltage VMSB corresponding to the MSB MSBd of the digital analog signal DATAd and the voltage VLSU' corresponding to the LSB LSBd.

Figure 15:
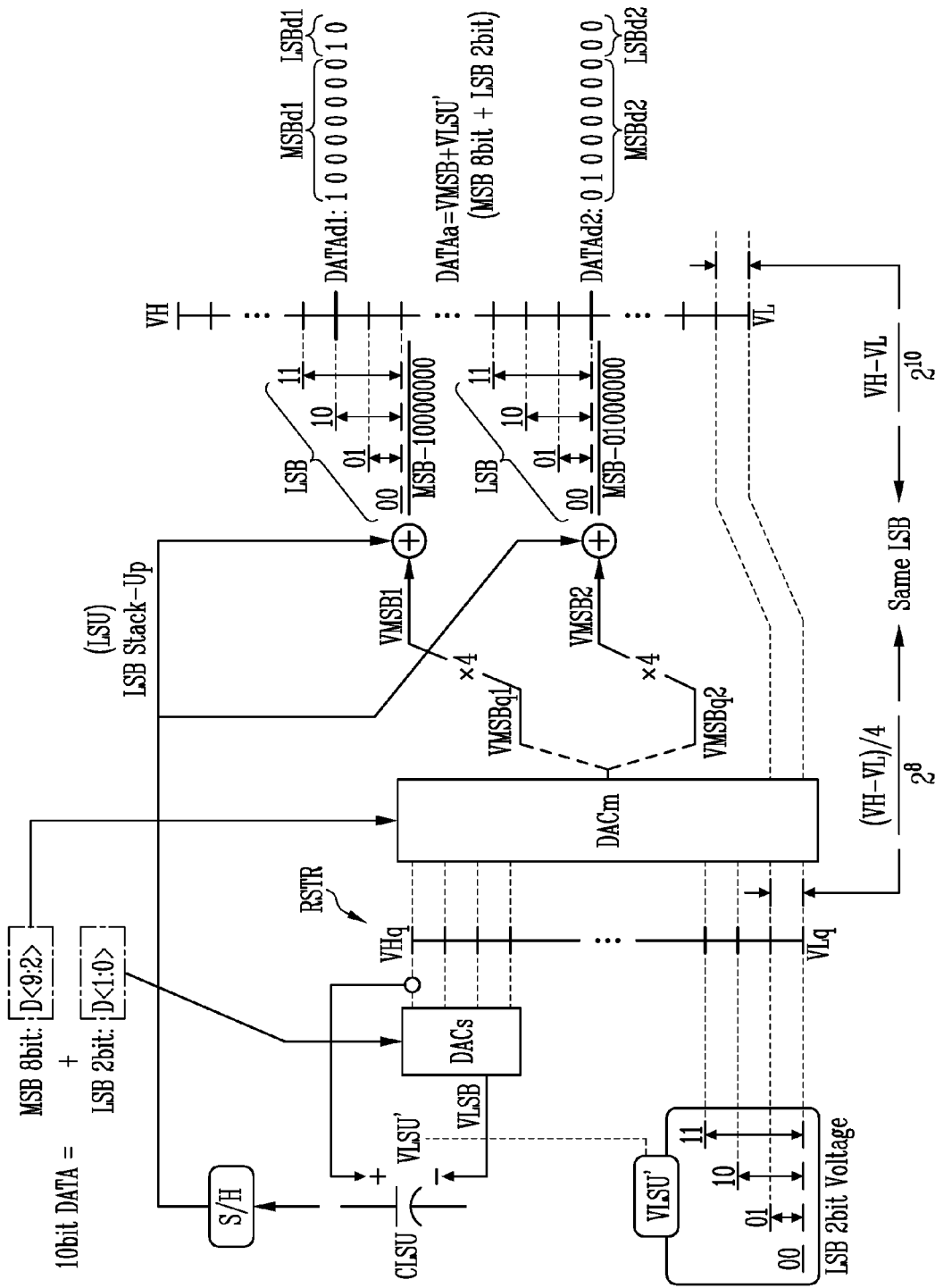
FIG. 15 is a diagram illustrating a process in which a digital data signal is converted into an analog data voltage.

FIG. 15 is a diagram illustrating a process in which the digital data signal is converted into the analog data voltage.

The data channel CH1 of the data driver 12 of the present embodiment has an advantage that the data channel CH1 may generate the analog data voltage DATAa of a relatively large voltage range VH-VL (i.e., voltage difference between the voltage VH and the voltage VL) using a relatively small voltage range VHq-VLq (i.e., voltage difference between the voltage VHq and the voltage VLq). For example, in Equation 1, when s is set to 2 and N is set to 4, the voltage VH may correspond to 4 times the voltage VHq, and the voltage VL may correspond to 4 times the voltage VLq. Therefore, the main digital-to-analog converter DACm and the sub digital-to-analog converter DACs may be configured to use a low-voltage MOSFET (LVMOS) rather than a high-voltage MOSFET (HVMOS). Therefore, the data channel CH1 has an advantage that the data channel CH1 does not require a level shifter and integration is easy by a small area of a MOSFET.

Hereinafter, for convenience of description, it is assumed that exemplary digital data signals DATAd1 and DATAd2 are configured of bits, MSBs MSBd1 and MSBd2 are configured of 8 bits, and LSBs LSBd1 and LSBd2 are configured of 2 bits. A case where the digital data signal DATAd1 of a first example is configured of "1000000000" and the digital data signal DATAd2 of a second example is configured of "0100000000" is described as an example. In a case according to the prior art, in order to generate an analog data voltage corresponding to 10 bits, a resistor string may include $2^{10}$ resistors. Assuming that each of resistances of the resistor string are the same, a voltage applied to the high voltage node is the voltage VH, and a voltage applied to the low voltage node is the voltage VL, a magnitude of a voltage VRC applied to each resistor is as shown in Equation 4 below.

$$VRC = (VH - VL)/(2^{10})$$  [Equation 4]

According to the present embodiment, the resistor string RSTR may include $2^8$ resistors to generate voltages corresponding to 8 bits that are the MSB. Assuming that the magnitudes of each of the resistors of the resistor string are the same, the voltage applied to the high voltage node is a voltage (VHq=VH/4), and the voltage applied to the low voltage node is a voltage (VLq=VL/4), a magnitude of a voltage VRP applied to each resistor is as shown in Equation 5 below.

$$VRP = (VHq - VLq)/(2^8) = (VH/4 - VL/4)/(2^8) = (VH - VL)/(2^{10}) = VRC$$  [Equation 5]

That is, in the case of the prior art (10 bits) and in the case of the present embodiment (8 bits), the magnitudes of the voltages VRC and VRP distributed to each resistor are the same. The present embodiment uses such a point to enable the sub digital-to-analog converter DACs to output the voltage VLSB corresponding to the LSBs LSBd1 and LSBd2. Although voltages VMSBq1 and VMSBq2 corresponding to the MSBs MSBd1 and MSBd2 output from the main digital-to-analog converter DACm are smaller than that of the case of bits, the same voltages VMSB1 and VMSB2 as the case of 10 bits may be generated using the multiplier MLTP. The voltage synthesizer VSYN may generate a final analog data voltage DATAa by synthesizing the voltage VMSB and the voltage VLSU' corresponding to the voltage VLSB.

FIGS. 16 to 19 are diagrams illustrating advantages of a data driving circuit according to an embodiment of the disclosure.

Figure 16:
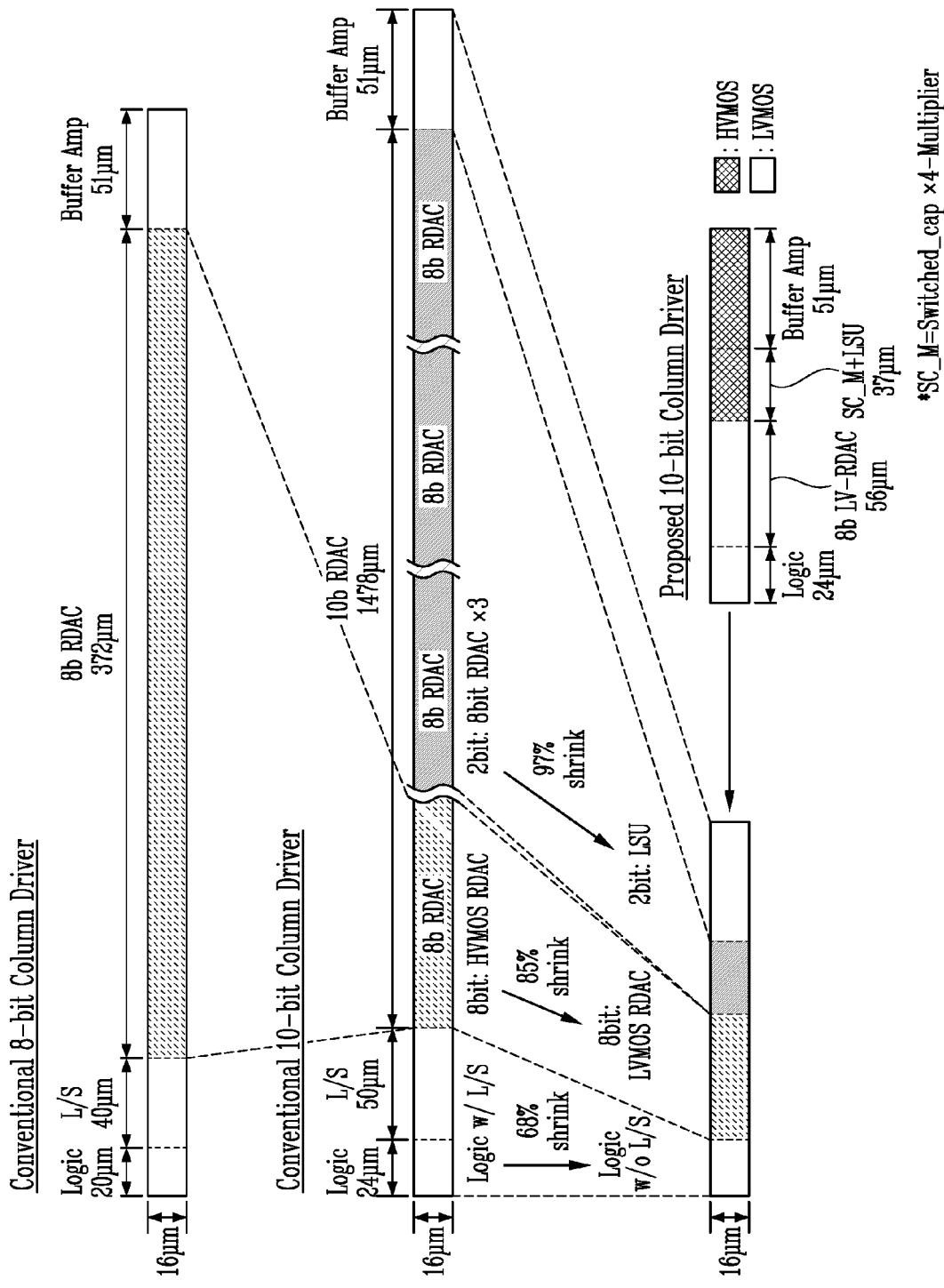
FIGS. 16 to 19 are diagrams illustrating advantages of a data driving circuit according to an embodiment of the disclosure.

Referring to FIG. 16, the data driving circuit according to the present embodiment may reduce the total area by about 65 percentages (%) compared to a 8-bit column driver of the prior art. Meanwhile, the data driving circuit of the present embodiment may reduce the total area by about 89% compared to a 10-bit column driver of the prior art.

Specifically, since the data driving circuit of the present embodiment does not use a level shifter, a size of a logic circuit is reduced by 68%, and since the main digital-to-analog converter DACm uses the LVMOS, the size is reduced by 85%. Meanwhile, regarding a part that additionally generates 2 bits, the size is reduced by 97% due to LSB-stack-up topology of the present embodiment.

Figure 17:
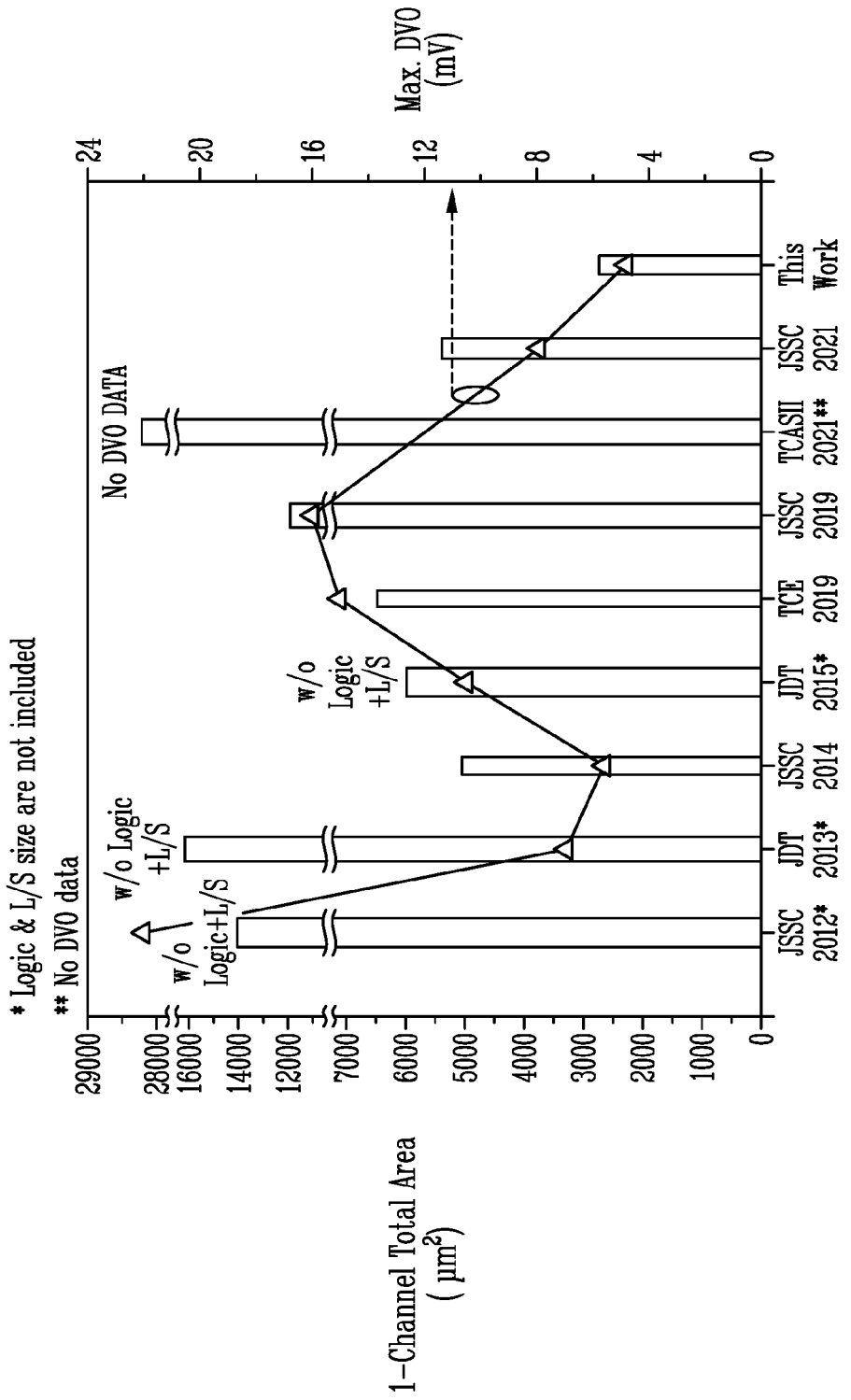

Referring to FIG. 17, a graph comparing the channel total area (left, unit: square micrometers ($\mu m^2$)) and deviation of voltage offset ("DVO", that is, uniformity, right, unit: millivoltages (mV)) of a column driver IC reported over the past 10 years is shown. It may be seen that both of the area and the DVO of the data driving circuit according to the present embodiment exhibit the lowest values, thereby exhibiting the highest performance.

Figure 18:
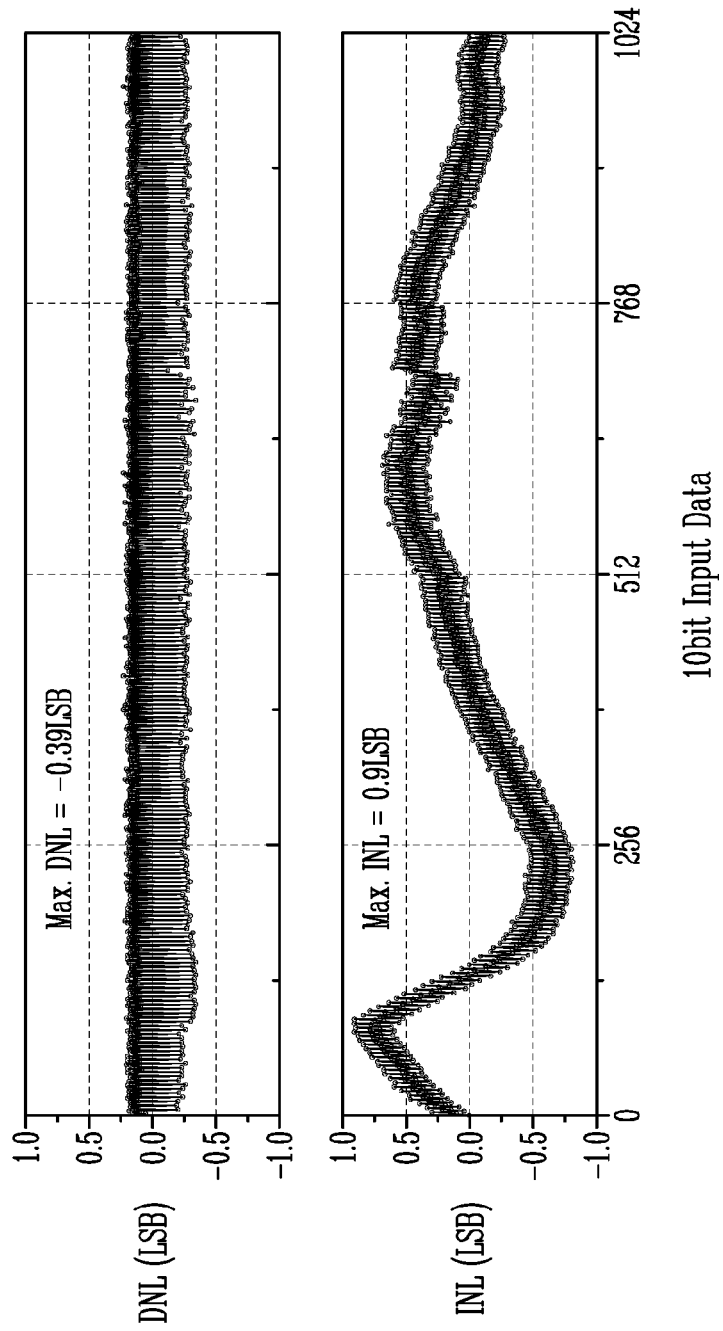
Figure 19:
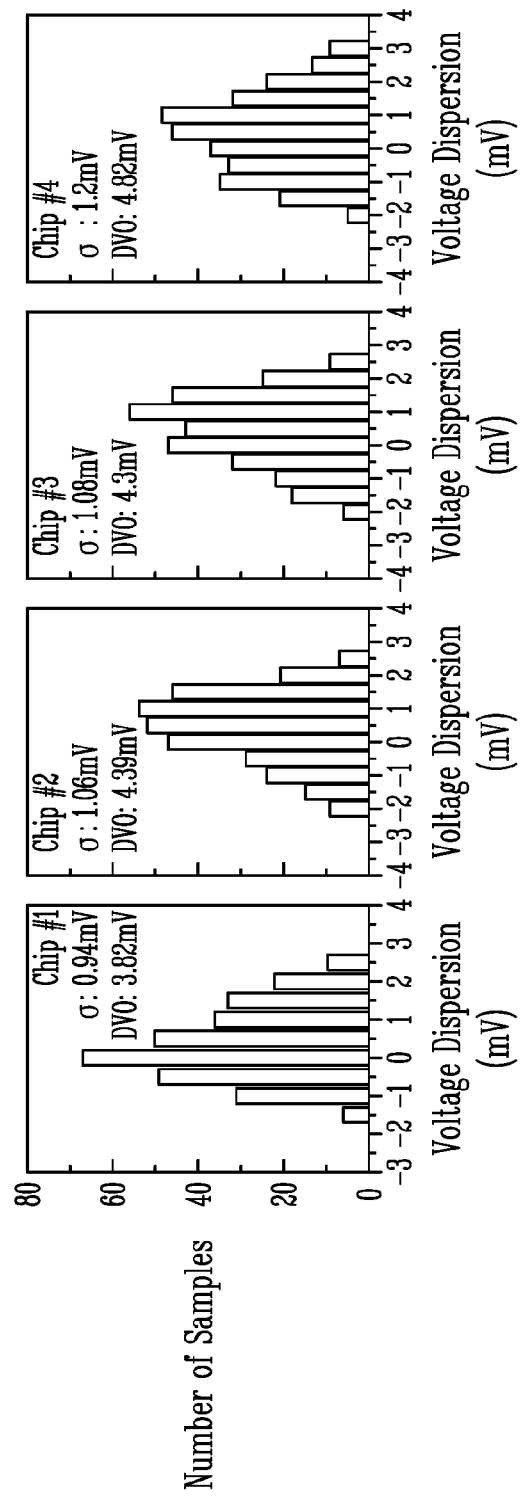

FIG. 18 is a graph illustrating a linearity of the data driving circuit according to the present embodiment. FIG. 19 is a graph illustrating a channel-to-channel deviation of voltage offset (DVO) of the data driving circuit according to the present embodiment. Referring to FIGS. 18 and 19, the data driving circuit according to the present embodiment shows a differential non-linearity ("DNL") of 0.5 LSB or less, an integral non-linearity ("INL") of 1 LSB or less, and good DVO performance of a maximum of 4.82 mV.

The drawings referred to so far and the detailed description of the disclosure described herein are merely examples of the disclosure, are used for merely describing the disclosure, and are not intended to limit the meaning and the scope of the disclosure described in claims. Therefore, those skilled in the art will understand that various modifications and equivalent other embodiments are possible from these. Thus, the true scope of the disclosure should be determined by the technical spirit of the appended claims.

What is claimed is:

1. A data driving circuit comprising:
   a resistor string in which a plurality of resistors are connected in series;

a main digital-to-analog converter connected to the resistor string;
a multiplier connected to an output terminal of the main digital-to-analog converter;
a sub digital-to-analog converter connected to the resistor string; and
a voltage synthesizer connected to an output terminal of the multiplier and an output terminal of the sub digital-to-analog converter,
wherein the voltage synthesizer generates an analog data voltage by synthesizing an output voltage of the multiplier and an output voltage of the sub digital-to-analog converter.

2. The data driving circuit according to claim 1, wherein the output voltage of the multiplier is a voltage corresponding to most significant bits (MSB) of a digital data signal, and
the output voltage of the sub digital-to-analog converter is a voltage corresponding to least significant bits (LSB) of the digital data signal.

3. The data driving circuit according to claim 1, wherein the voltage synthesizer comprises:
a sampling capacitor;
a first switch configured to connect the output terminal of the sub digital-to-analog converter and a first electrode of the sampling capacitor;
an amplifier;
a second switch configured to connect a second electrode of the sampling capacitor and a first input terminal of the amplifier;
a third switch configured to connect the resistor string to a second input terminal of the amplifier;
a fourth switch configured to connect the output terminal of the multiplier and the second input terminal of the amplifier; and
a fifth switch configured to connect the first electrode of the sampling capacitor and the first input terminal of the amplifier.

4. The data driving circuit according to claim 3, wherein the first switch and the third switch are turned on when receiving a first switching signal,
the fourth switch is turned on when receiving an inverted signal of the first switching signal,
the second switch is turned on when receiving a second switching signal, and
the fifth switch is turned on when receiving an inverted signal of the second switching signal.

5. The data driving circuit according to claim 4, wherein the voltage synthesizer further comprises:
a first offset inverter configured to connect the second switch to one of the first input terminal of the amplifier and the second input terminal of the amplifier and connect the third switch to another one of the first input terminal of the amplifier and the second input terminal of the amplifier; and
a second offset inverter positioned inside the amplifier, and connected between the first input terminal of the amplifier and the second input terminal of the amplifier.

6. The data driving circuit according to claim 5, wherein when the first offset inverter and the second offset inverter receive the first switching signal, the first offset inverter and the second offset inverter invert an input offset voltage of the amplifier and apply the input offset voltage to the second electrode of the sampling capacitor.

7. The data driving circuit according to claim 3, wherein the multiplier outputs an output voltage corresponding to N times an input voltage of the multiplier,
the multiplier includes (N−1) capacitors, and
N is an integer greater than 1.

8. The data driving circuit according to claim 7, wherein the (N−1) capacitors include a first capacitor, a second capacitor, and a third capacitor,
the multiplier further comprises:
a sixth switch configured to connect an input terminal of the multiplier and a first electrode of the first capacitor;
a seventh switch configured to connect a second electrode of the first capacitor and a reference power;
an eighth switch configured to connect the second electrode of the first capacitor and the input terminal of the multiplier;
a ninth switch configured to connect the first electrode of the first capacitor and a first electrode of the second capacitor;
a tenth switch configured to connect a second electrode of the second capacitor and the reference power;
an eleventh switch configured to connect the second electrode of the second capacitor and the input terminal of the multiplier;
a twelfth switch configured to connect the first electrode of the second capacitor and a first electrode of the third capacitor;
a thirteenth switch configured to connect a second electrode of the third capacitor and the reference power;
a fourteenth switch configured to connect the second electrode of the third capacitor and the input terminal of the multiplier; and
a fifteenth switch configured to connect the first electrode of the third capacitor and the output terminal of the multiplier.

9. The data driving circuit according to claim 8, wherein the sixth, seventh, eleventh, twelfth, and thirteenth switches are turned on when a clock signal is a first logic level, and
the eighth, ninth, tenth, fourteenth, and fifteenth switches are turned on when the clock signal is a second logic level different from the first logic level.

10. A display device comprising:
pixels configured to receive an analog data voltage and display an image corresponding to the analog data voltage; and
a data driver configured to transmit the analog data voltage to the pixels,
wherein the data driver comprises:
a resistor string in which a plurality of resistors are connected in series;
a main digital-to-analog converter connected to the resistor string;
a multiplier connected to an output terminal of the main digital-to-analog converter;
a sub digital-to-analog converter connected to the resistor string; and
a voltage synthesizer connected to an output terminal of the multiplier and an output terminal of the sub digital-to-analog converter,
wherein the voltage synthesizer generates the analog data voltage by synthesizing an output voltage of the multiplier and an output voltage of the sub digital-to-analog converter.

11. The display device according to claim 10, wherein the output voltage of the multiplier is a voltage corresponding to an MSB of a digital data signal, and
the output voltage of the sub digital-to-analog converter is a voltage corresponding to an LSB of the digital data signal.

12. The display device according to claim 10, wherein the voltage synthesizer comprises:
a sampling capacitor;
a first switch configured to connect the output terminal of the sub digital-to-analog converter and a first electrode of the sampling capacitor;
an amplifier;
a second switch configured to connect a second electrode of the sampling capacitor and a first input terminal of the amplifier;
a third switch configured to connect the resistor string to a second input terminal of the amplifier;
a fourth switch configured to connect the output terminal of the multiplier and the second input terminal of the amplifier; and
a fifth switch configured to connect the first electrode of the sampling capacitor and the first input terminal of the amplifier.

13. The display device according to claim 12, wherein the first switch and the third switch are turned on when receiving a first switching signal,
the fourth switch is turned on when receiving an inverted signal of the first switching signal,
the second switch is turned on when receiving a second switching signal, and
the fifth switch is turned on when receiving an inverted signal of the second switching signal.

14. The display device according to claim 13, wherein the voltage synthesizer further comprises:
a first offset inverter configured to connect the second switch to one of the first input terminal of the amplifier and the second input terminal of the amplifier and connect the third switch to another one of the first input terminal of the amplifier and the second input terminal of the amplifier; and
a second offset inverter positioned inside the amplifier, and connected between the first input terminal of the amplifier and the second input terminal of the amplifier.

15. The display device according to claim 14, wherein when the first offset inverter and the second offset inverter receive the first switching signal, the first offset inverter and the second offset inverter invert an input offset voltage of the amplifier and apply the input offset voltage to the second electrode of the sampling capacitor.

16. The display device according to claim 12, wherein the multiplier outputs an output voltage corresponding to N times an input voltage of the multiplier,
the multiplier includes (N−1) capacitors, and
N is an integer greater than 1.

17. The display device according to claim 16, wherein the (N−1) capacitors include a first capacitor, a second capacitor, and a third capacitor,
the multiplier further comprises:
a sixth switch configured to connect an input terminal of the multiplier and a first electrode of the first capacitor;
a seventh switch configured to connect a second electrode of the first capacitor and a reference power;
an eighth switch configured to connect the second electrode of the first capacitor and the input terminal of the multiplier;
a ninth switch configured to connect the first electrode of the first capacitor and a first electrode of the second capacitor;
a tenth switch configured to connect a second electrode of the second capacitor and the reference power;
an eleventh switch configured to connect the second electrode of the second capacitor and the input terminal of the multiplier;
a twelfth switch configured to connect the first electrode of the second capacitor and a first electrode of the third capacitor;
a thirteenth switch configured to connect a second electrode of the third capacitor and the reference power;
a fourteenth switch configured to connect the second electrode of the third capacitor and the input terminal of the multiplier; and
a fifteenth switch configured to connect the first electrode of the third capacitor and an output terminal of the multiplier.

18. The display device according to claim 17, wherein the sixth, seventh, eleventh, twelfth, and thirteenth switches are turned on when a clock signal is a first logic level, and
the eighth, ninth, tenth, fourteenth, and fifteenth switches are turned on when the clock signal is a second logic level different from the first logic level.

19. A data driving circuit comprising:
a resistor string in which a plurality of resistors are connected in series;
a main digital-to-analog converter connected to the resistor string;
a multiplier connected to an output terminal of the main digital-to-analog converter;
a sub digital-to-analog converter connected to the resistor string; and
a voltage synthesizer connected to an output terminal of the multiplier and an output terminal of the sub digital-to-analog converter,
wherein the voltage synthesizer comprises:
a sampling capacitor;
a first switch configured to connect the output terminal of the sub digital-to-analog converter and a first electrode of the sampling capacitor;
an amplifier;
a second switch configured to connect a second electrode of the sampling capacitor and a first input terminal of the amplifier;
a third switch configured to connect the resistor string to a second input terminal of the amplifier;
a fourth switch configured to connect the output terminal of the multiplier and the second input terminal of the amplifier; and
a fifth switch configured to connect the first electrode of the sampling capacitor and the first input terminal of the amplifier.

* * * * *